(12) United States Patent
Okada et al.

(10) Patent No.: US 11,257,944 B2
(45) Date of Patent: Feb. 22, 2022

(54) SEMICONDUCTOR DEVICE AND SEMICONDUCTOR DEVICE MANUFACTURING METHOD

(71) Applicant: ROHM CO., LTD., Kyoto (JP)

(72) Inventors: Shigenari Okada, Kyoto (JP); Masaki Nagata, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 15/565,826

(22) PCT Filed: Apr. 22, 2016

(86) PCT No.: PCT/JP2016/062810
§ 371 (c)(1),
(2) Date: Oct. 11, 2017

(87) PCT Pub. No.: WO2016/175152
PCT Pub. Date: Nov. 3, 2016

(65) Prior Publication Data
US 2018/0114857 A1 Apr. 26, 2018

(30) Foreign Application Priority Data

Apr. 27, 2015 (JP) .............................. JP2015-090576
Apr. 27, 2015 (JP) .............................. JP2015-090577

(51) Int. Cl.
*H01L 29/78* (2006.01)
*H01L 29/417* (2006.01)
(Continued)

(52) U.S. Cl.
CPC .... *H01L 29/7813* (2013.01); *H01L 21/28114* (2013.01); *H01L 21/28194* (2013.01);
(Continued)

(58) Field of Classification Search
CPC ............... H01L 29/407; H01L 29/7813; H01L 29/42368; H01L 29/66727
See application file for complete search history.

(56) References Cited

U.S. PATENT DOCUMENTS 8,871,593 B1 * 10/2014 Siemieniec ....... H01L 29/66734
438/272
2006/0017056 A1 1/2006 Hirler
(Continued)

FOREIGN PATENT DOCUMENTS

JP 2003318129 11/2003
JP 2006202931 A 8/2006
(Continued)

OTHER PUBLICATIONS

International Preliminary Report on Patentability for International Patent Application No. PCT/JP2016/062810, dated Nov. 9, 2017, 15 pages including English translation.
(Continued)

*Primary Examiner* — Samuel A Gebremariam
*Assistant Examiner* — Jonas T Beardsley
(74) *Attorney, Agent, or Firm* — Hamre, Schumann, Mueller & Larson, P.C.

(57) ABSTRACT

A semiconductor device according to the present invention includes a semiconductor layer, a gate trench defined in the semiconductor layer, a first insulating film arranged on the inner surface of the gate trench, a gate electrode arranged in the gate trench via the first insulating film, and a source layer, a body layer, and a drain layer arranged laterally to the gate trench, in which the first insulating film includes, at least at the bottom of the gate trench, a first portion and a second portion with a film elaborateness lower than that of the first portion from the inner surface of the gate trench in the film thickness direction.

13 Claims, 25 Drawing Sheets

(51) Int. Cl.
  *H01L 29/10* (2006.01)
  *H01L 21/28* (2006.01)
  *H01L 27/02* (2006.01)
  *H01L 29/40* (2006.01)
  *H01L 29/423* (2006.01)
  *H01L 29/66* (2006.01)
  *H01L 27/06* (2006.01)

(52) U.S. Cl.
  CPC .. *H01L 21/28211* (2013.01); *H01L 21/28229* (2013.01); *H01L 27/0255* (2013.01); *H01L 29/1095* (2013.01); *H01L 29/404* (2013.01); *H01L 29/407* (2013.01); *H01L 29/41741* (2013.01); *H01L 29/41766* (2013.01); *H01L 29/4236* (2013.01); *H01L 29/42368* (2013.01); *H01L 29/66727* (2013.01); *H01L 29/66734* (2013.01); *H01L 21/28035* (2013.01); *H01L 21/28238* (2013.01); *H01L 27/0629* (2013.01); *H01L 29/42376* (2013.01); *H01L 29/7804* (2013.01); *H01L 29/7808* (2013.01)

(56) References Cited

U.S. PATENT DOCUMENTS

2007/0059887 A1* 3/2007 Poelzl ............... H01L 29/66734
                                                              438/270
2012/0319199 A1* 12/2012 Zeng ................. H01L 29/66727
                                                              257/334
2013/0164895 A1* 6/2013 Zeng ................. H01L 29/66734
                                                              438/270
2013/0302958 A1* 11/2013 Hossain ............. H01L 29/4916
                                                              438/270

FOREIGN PATENT DOCUMENTS

| JP | 2009135360 | 6/2009 |
| JP | 2009224365 A | 10/2009 |
| JP | 2010129973 A | 6/2010 |
| JP | 2012039133 | 2/2012 |
| JP | 2014187226 | 10/2014 |

OTHER PUBLICATIONS

International Search Report for PCT/JP2016/062810, dated Jul. 12, 2016, 3 pages including English translation.

Office Action issued for Japanese Patent Application No. 2017-515531, dated Jun. 25, 2020, 4 pages including English machine translation.

Reconsideration Report by Examiner before Appeal issued for Japanese Patent Application No. 2020-016349, dated Jan. 29, 2021, 5 pages including English machine translation.

* cited by examiner

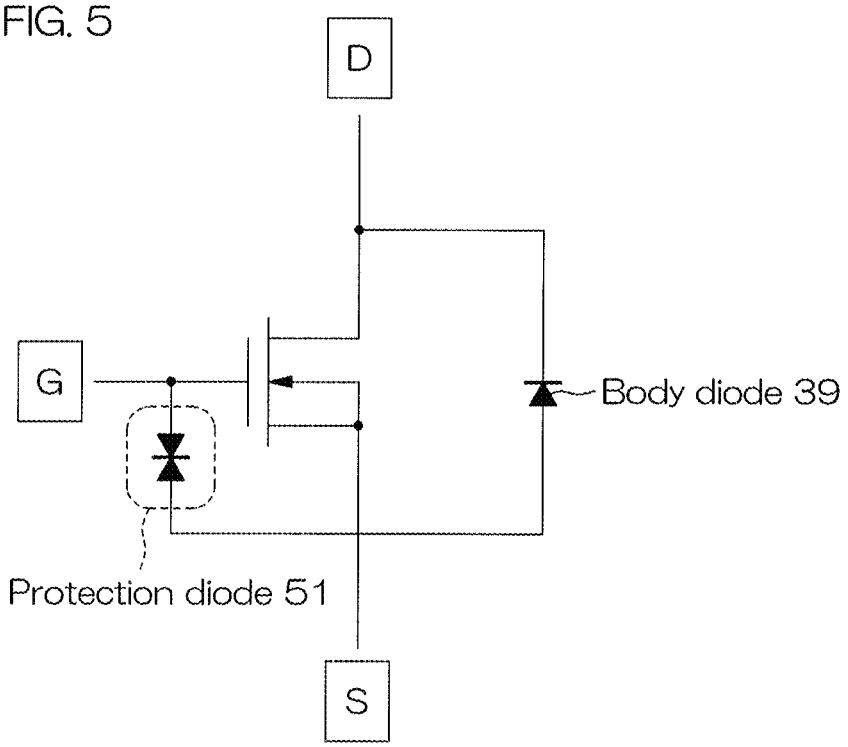

SEMICONDUCTOR DEVICE AND SEMICONDUCTOR DEVICE MANUFACTURING METHOD

TECHNICAL FIELD

The present invention relates to a semiconductor device having a trench gate structure and a method for manufacturing the semiconductor device.

BACKGROUND ART

Patent Document 1 discloses a semiconductor device including a semiconductor substrate, a first groove defined in the semiconductor substrate, a dummy gate electrode and a gate electrode within the first groove, an $n^+$ type semiconductor region for use as a source and a p type semiconductor region for channel definition both defined in the semiconductor substrate, a second groove defined in the semiconductor substrate, a $p^+$ type semiconductor region at the bottom of the second groove, and a source metal connected to the $n^+$ type semiconductor region and the $p^+$ type semiconductor region.

PRIOR ART DOCUMENTS

Patent Document

Patent Document 1: Japanese Patent Application Publication No. 2006-202931

SUMMARY OF THE INVENTION

Problems to be Solved by the Invention

In trench-type MISFETs, a gate insulating film is generally defined through thermal oxidation, as described in Patent Document 1.

However, defining such a gate insulating film only through thermal oxidation is likely to cause a reduced film thickness at the trench bottom due to thermal oxidation stress. Such a reduced film thickness at the trench bottom would make it difficult to ensure voltage resistance at the trench bottom where an electric field is likely to concentrate and also make a leakage current more likely to occur. On the other hand, increasing the thermal oxidation time to increase the film thickness at the trench bottom would in turn cause the film thickness on the trench side wall to be greater than a desired value, which may affect the device property.

A preferred embodiment of the present invention provides a semiconductor device with increased MIS structure voltage resistance and reduced leakage current for increased device electrostatic destruction resistance (ESD resistance), and a method for manufacturing such a semiconductor device.

Means for Solving the Problems

A preferred embodiment of the present invention provides a semiconductor device manufacturing method including the steps of defining a gate trench in a semiconductor layer, forming a thermal oxidation film on the inner surface of the gate trench and subsequently depositing a deposition insulating film on the thermal oxidation film to define a first insulating film having a portion composed of the deposition insulating film and the thermal oxidation film at least at the bottom of the gate trench, after defining the first insulating film, embedding a gate electrode in the gate trench, and defining a source layer, a body layer, and a drain layer laterally to the gate trench.

In accordance with the arrangement above, the first insulating film is formed of the thermal oxidation film and the deposition insulating film, which is not a thermal oxidation film, at least at the bottom of the gate trench, whereby the effect of the thermal oxidation stress at the trench bottom can be reduced. This allows the first insulating film to be thickened easily at the trench bottom, with increased MIS structure voltage resistance and reduced leakage current for increased device electrostatic destruction resistance (ESD resistance).

A semiconductor device manufactured by the above method may include a semiconductor layer, agate trench defined in the semiconductor layer, a first insulating film arranged on the inner surface of the gate trench, a gate electrode arranged in the gate trench via the first insulating film, and a source layer, a body layer, and a drain layer arranged laterally to the gate trench, in which the first insulating film includes, at least at the bottom of the gate trench, a first portion and a second portion with a film elaborateness lower than that of the first portion from the inner surface of the gate trench in the film thickness direction.

That is, the first portion, which has a relatively high film elaborateness, is derived from the thermal oxidation film, while the second portion, which has a film elaborateness lower than that of the first portion, is derived from the deposition insulating film. A clearly definable film interface may or may not exist between the first portion and the second portion. It is noted that the film elaborateness can be determined, for example, based on the difference in the rate of etching of the insulating film using common etching gas or etching liquid.

In a preferred embodiment of the present invention, the thermal oxidation film is formed to be thinner than the deposition insulating film.

This allows the effect of the thermal oxidation stress at the trench bottom to be further reduced.

In a preferred embodiment of the present invention, the thermal oxidation film is formed to have a thickness of 400 Å to 800 Å and the deposition insulating film is formed to have a thickness of 200 Å to 500 Å.

A preferred embodiment of the present invention further includes the steps of, after forming the deposition insulating film, embedding an electrode material at an intermediate depth of the gate trench, selectively etching and removing the first insulating film above the electrode material to define a line insulating film, and covering the side surface of the gate trench exposed through the etching of the first insulating film with a gate insulating film.

In accordance with the arrangement above, the thickness of the gate insulating film opposed to the body layer (channel defining portion) around the trench side surface can be designed separately from the thickness of the line insulating film at the trench bottom, which makes it possible to achieve a good channel property regardless of the thickness of the line insulating film at the trench bottom.

In a preferred embodiment of the present invention, the exposed side surface of the gate trench is covered with the gate insulating film through thermal oxidation.

In accordance with the arrangement above, a good film can be formed on the body layer (channel defining portion) around the trench side surface.

In a preferred embodiment of the present invention, the deposition insulating film is formed by a CVD (Chemical Vapor Deposition) method or a PVD (Physical Vapor Deposition method.

A preferred embodiment of the present invention further includes an embedded electrode arranged below the gate electrode in the gate trench, in which the first insulating film includes a gate insulating film covering the gate electrode for insulation separation between the gate electrode and the embedded electrode and a line insulating film covering the embedded electrode, and in which the first portion and the second portion of the first insulating film are provided in the line insulating film.

In a preferred embodiment of the present invention, the gate insulating film has the same degree of elaborateness as the first portion from the inner surface of the gate trench in the entire film thickness direction.

In a preferred embodiment of the present invention, the film thickness of a boundary portion between the gate insulating film and the line insulating film is equal to or greater than 75% of the film thickness of the gate insulating film.

In a preferred embodiment of the present invention, the first insulating film is composed of silicon oxide.

In a preferred embodiment of the present invention, the gate electrode is composed of polysilicon.

A preferred embodiment of the present invention further includes a field plate trench defined in the semiconductor layer in a manner spaced from the gate trench and a field plate arranged in the field plate trench via a second insulating film, in which the second insulating film includes, at least at the bottom of the field plate trench, a first portion and a second portion with a film elaborateness lower than that of the first portion from the inner surface of the field plate trench in the film thickness direction.

In a preferred embodiment of the present invention, the field plate includes an upper field plate and a lower field plate insulated and separated vertically, and in which the first portion and the second portion of the second insulating film are provided in a portion of the second insulating film covering the lower field plate.

BRIEF DESCRIPTION OF THE DRAWINGS

FIG. 5 is a circuit diagram of the semiconductor device.

DETAILED DESCRIPTION OF THE PREFERRED EMBODIMENTS

Preferred embodiments of the present invention will hereinafter be described in detail with reference to the accompanying drawings.

Figure 1:
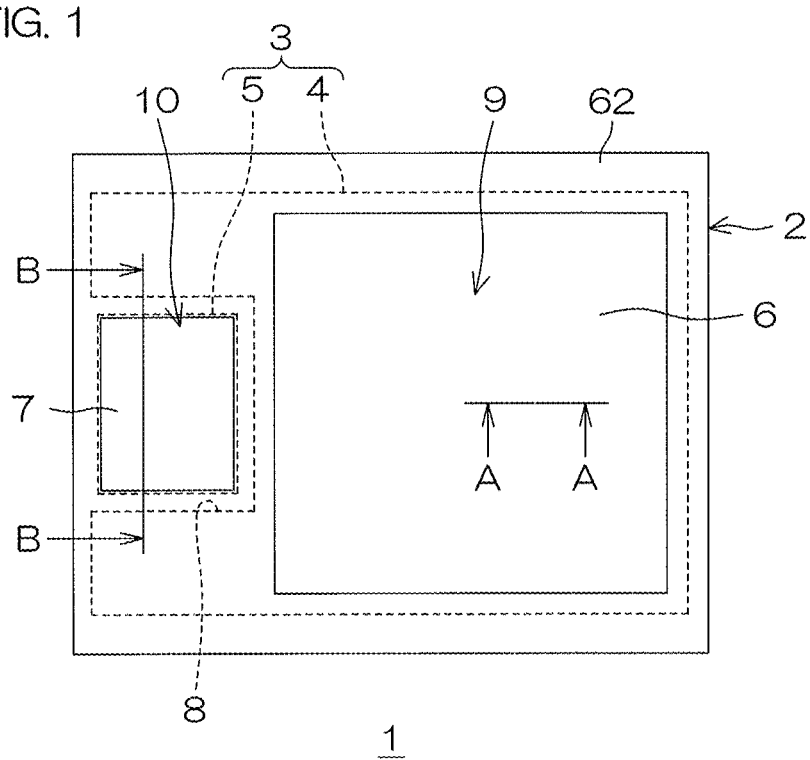
FIG. 1 is a schematic plan view of a semiconductor device according to a preferred embodiment of the present invention.

FIG. 1 is a schematic plan view of a semiconductor device 1 according to a preferred embodiment of the present invention.

The semiconductor device 1 has a semiconductor substrate 2 as an example of a semiconductor layer according to the present invention. The semiconductor substrate 2 has a quadrilateral shape in a plan view. An electrode film 3 made of, for example, metal material (e.g. Al) is defined on the surface of the semiconductor substrate 2. The electrode film 3 may include a source metal 4 and a gate metal 5. The source metal 4 is defined so as to cover almost the entire area in a central portion of the semiconductor substrate 2, while the gate metal 5 is defined in a peripheral portion of the semiconductor substrate 2. The source metal 4 and the gate metal 5 are covered with a passivation film 62. The source metal 4 and the gate metal 5 are partially exposed through the passivation film 62, respectively, as a source pad 6 and a gate pad 7. Bonding members such as bonding wires (not shown) may be bonded to the source pad 6 and the gate pad 7.

A boundary portion 8 from which the material of the electrode film 3 is selectively removed is set between the source metal 4 and the gate metal 5. The boundary portion 8 may surround the gate metal 5 as shown in FIG. 1 or may be linear along a part of the periphery of the gate metal 5.

On the semiconductor substrate 2, there may be set an active region 9 in which many MIS FET unit cells are defined and a non-active region 10 excluding the active region 9. The active region 9 may be arranged in a region below the source pad 6 of the source metal 4. On the other hand, the non-active region 10 may be arranged in a region below the gate metal 5 and may extend from the region across the boundary portion 8 to a region below and outside the source pad 6 of the source metal 4.

Next, the cross-sectional structures of the active region 9 and the non-active region 10 will be described.

Figure 2:
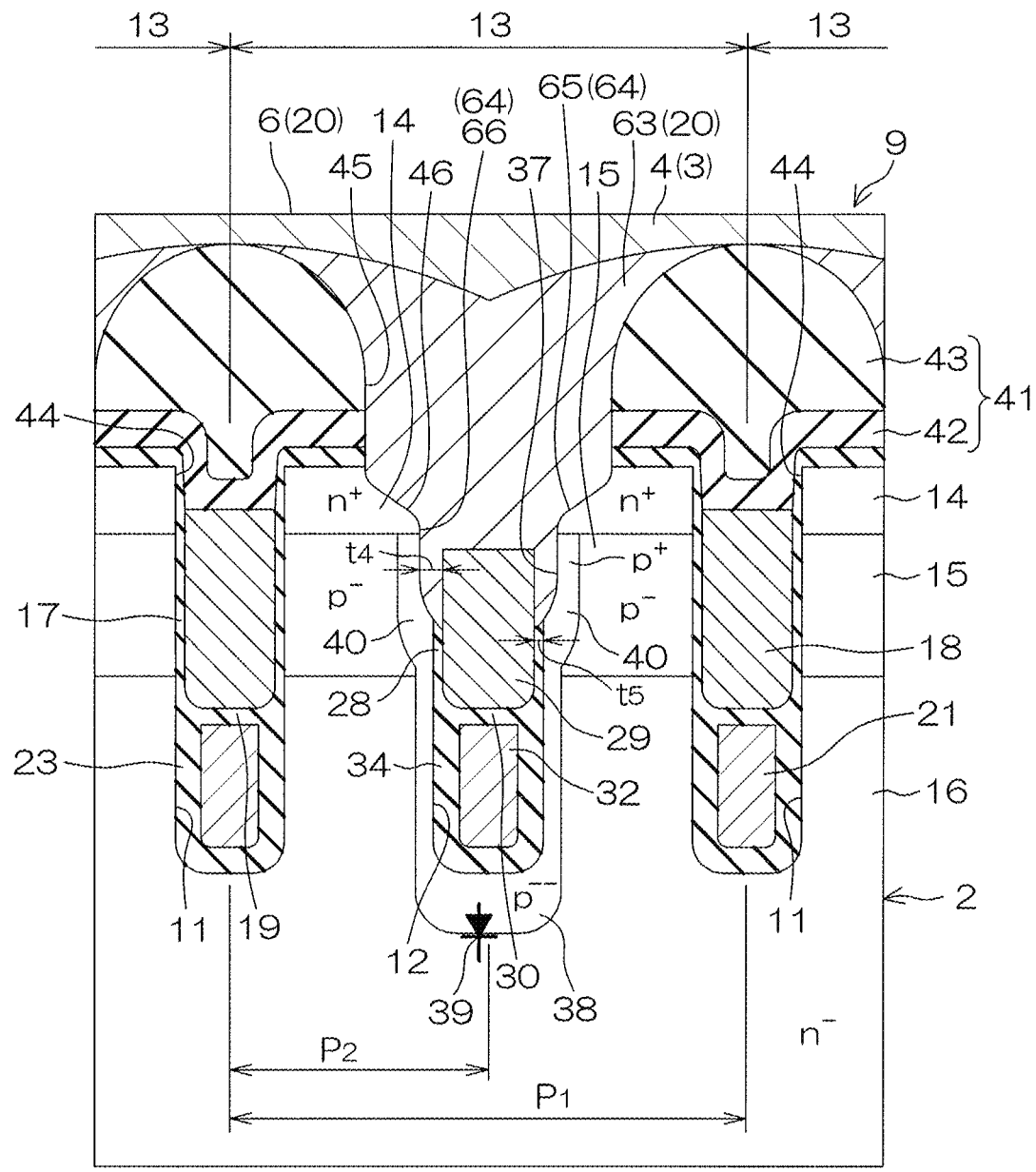
FIG. 2 is a cross-sectional view (taken along line A-A) of the semiconductor device shown in FIG. 1.
Figure 3:
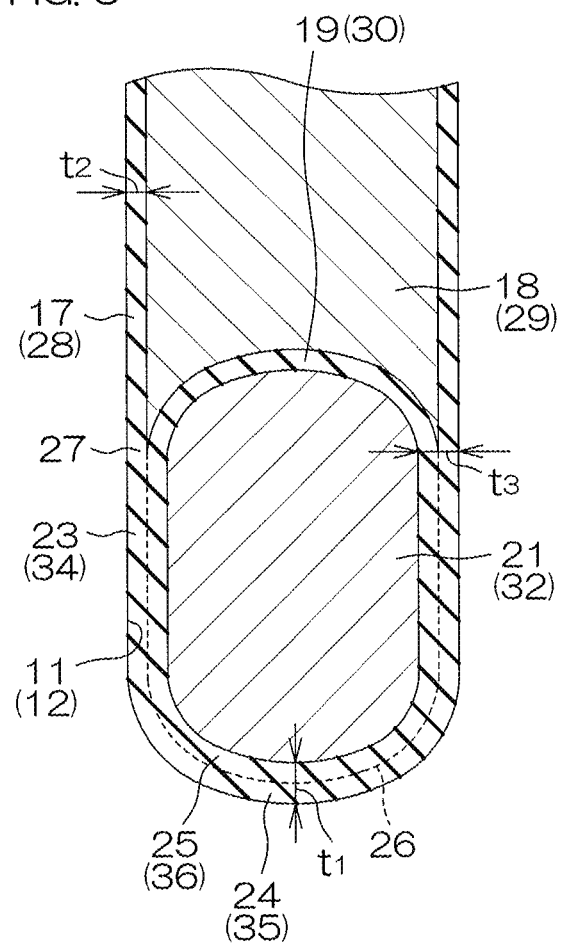
FIG. 3 is a partially enlarged view of a trench.

FIG. 2 is a cross-sectional view (taken along line A-A) of the semiconductor device 1 shown in FIG. 1, showing the cross-section of the active region 9. FIG. 3 is a partially enlarged view of trenches 11, 12. It is noted that FIG. 3 shows components just necessary for the description thereof.

The semiconductor device 1 includes the semiconductor substrate 2. The semiconductor substrate 2 may be, for example, a silicon substrate. The semiconductor substrate 2 may include a base substrate and an epitaxial layer on the base substrate.

A gate trench 11 and a field plate trench 12 are defined in the semiconductor substrate 2. For example, a plurality of gate trenches 11 are defined as stripe-patterned, and a MISFET unit cell 13 is defined between adjacent ones of the gate trenches 11. The field plate trench 12 may be defined in each unit cell 13 in parallel with the gate trenches 11. The gate trenches 11 and the field plate trench 12 have the same depth. The pitch $P_1$ between the gate trenches 11 adjacent to each other with the field plate trench 12 therebetween may be, for example, 1.0 µm to 3.0 µm. The pitch $P_2$ between the gate trenches 11 and the field plate trench 12 may also be, for example, 0.4 µm to 2.0 µm.

Impurity regions such as an $n^+$ type source layer 14, a $p^-$ type body layer 15, and an $n^-$ type drain layer 16 are defined in each unit cell 13. The $n^+$ type source layer 14, the $p^-$ type body layer 15, and the $n^-$ type drain layer 16 are aligned and arranged in this order in the thickness direction from the surface to the underside of the semiconductor substrate 2. This causes the $n^+$ type source layer 14, the $p^-$ type body layer 15, and the $n^-$ type drain layer 16 to be exposed to the side surfaces of both the gate trenches 11 and the field plate trench 12 in this order from each opening end. The $n^-$ type drain layer 16 also extends in a region below the gate trenches 11 and the field plate trench 12 to form a MISFET drift layer.

The concentration of each impurity region will be supplemented. The $n^+$ type source layer 14 has an impurity concentration of, for example, $1 \times 10^{20}$ cm$^{-3}$ to $1 \times 10^{22}$ cm$^{-3}$, the $p^-$ type body layer 15 has an impurity concentration of, for example, $1 \times 10^{17}$ cm$^{-3}$ to $1 \times 10^{19}$ cm$^-$, and the n type drain layer 16 has an impurity concentration of, for example, $1 \times 10^{16}$ cm$^{-3}$ to $1 \times 10^{18}$ cm$^{-3}$.

A gate insulating film 17 is formed on the inner surface of each of the gate trenches 11 and, via the gate insulating film 17, a gate electrode 18 is embedded in the gate trench 11. The gate insulating film 17 is composed of, for example, silicon oxide, while the gate electrode 18 is composed of, for example, polysilicon.

The gate electrode 18 is provided to define a channel in the $p^-$ type body layer 15 around the side surface of the gate trench 11 and opposed to the $n^+$ type source layer 14, the $p^-$ type body layer 15, and the $n^-$ type drain layer 16 via the gate insulating film 17.

In this preferred embodiment, an embedded electrode 21 is embedded below the gate electrode 18 in the gate trench 11. The embedded electrode 21 and the gate electrode 18 are insulated and separated vertically with the bottom 19 of the gate insulating film 17 therebetween. The embedded electrode 21 is composed of, for example, polysilicon. A line insulating film 23 composed of, for example, silicon oxide is also interposed between the embedded electrode 21 and the inner surface of the gate trench 11. The line insulating film 23 is formed along the inner surface of the gate trench 11 and, at the upper end thereof, integrated with the gate insulating film 17. The embedded electrode 21 may be covered with (the bottom 19 of) the gate insulating film 17 and the line insulating film 23 to be floated electrically with respect to the outside or have the same potential (ground potential) as the source metal 4. It is noted that in this preferred embodiment, the gate insulating film 17 and the line insulating film 23 are provided together as an example of a first insulating film according to the present invention.

As shown in FIG. 3, the line insulating film 23 may include a first portion 24 and a second portion 25 with a film elaborateness lower than that of the first portion 24 from the inner surface of the gate trench 11 in the film thickness direction. A clearly definable film interface may or may not exist between the first portion 24 and the second portion 25. In FIG. 3, a virtual interface 26 is indicated by the broken line. It is noted that the film elaborateness can be determined, for example, based on the difference in the rate of etching of the line insulating film 23 using common etching gas or etching liquid. For example, if the line insulating film 23 is composed of silicon oxide, it is only required to use hydrofluoric acid (HF).

On the other hand, the gate insulating film 17 may have the same degree of elaborateness as the first portion 24 of the line insulating film 23 from the inner surface of the gate trench 11 in the entire film thickness direction. The gate insulating film 17 may also extend to the opening end of the gate trench 11 and further formed on the surface of the semiconductor substrate 2.

The film thickness $t_1$ of the line insulating film 23 may be greater than the film thickness $t_2$ of the gate insulating film 17. For example, the film thickness $t_1$ of the line insulating film 23 at the bottom may be 50 nm to 150 nm, while the film thickness $t_2$ of the gate insulating film 17 may be 20 nm to 100 nm. Also, the film thickness $t_3$ of the boundary portion 27 between the gate insulating film 17 and the line insulating film 23 may be equal to or greater than 75% of the film thickness $t_2$ of the gate insulating film 17, for example, 15 nm to 150 nm.

An insulating film 28 is formed on the inner surface of the field plate trench 12 and, via the insulating film 28, a field plate 29 is embedded in the field plate trench 12 as an example of an upper field plate according to the present invention. The insulating film 28 is composed of, for example, silicon oxide, while the field plate 29 is composed of, for example, polysilicon.

As will be described hereinafter, the field plate 29 is electrically connected with the source metal 4 to have the source potential. Accordingly, in the third quadrant (forward-biased drain-body junction) operation in which the drain side is applied with a negative bias voltage (inversely biased) and the diffusion current generates minority carrier injection and high reverse recovery charge Qrr, the field plate 29 defines a majority carrier channel current path from the drain to the source in addition to the provision by the gate electrode 18. The combination of the field plate 29 and the gate electrode 18 thus exhibits an effect of reducing both the minority carrier diffusion current and the reverse recovery charge Qrr. Accordingly, in the third quadrant operation, the field plate 29 operates as an additional gate with no disadvantageous capacitance Cgd between an additional gate and the drain. In the above-described inversely biased operation, the field plate 29 can also reduce the electric field in the $p^-$ type body layer 15. This allows for a smaller channel length as well as reduction in the ON-resistance and the gate charge with no substantial risk of punch-through breakdown. Further, due to an increase in the source-drain voltage in an off state, the capacitive coupling of the gate trench 11, the field plate trench 12, and the $n^-$ type drain layer 16 depletes the $n^-$ type drain layer 16 more rapidly. The low Cgd and its high reduction rate with an increase in the source-drain voltage further reduce the gate-drain charge.

The upper end of the insulating film 28 may be positioned at an intermediate depth in the field plate trench 12. For example, as shown in FIG. 2, the upper end may be positioned at a depth of the p⁻ type body layer 15 around the side surface of the field plate trench 12. This defines a clearance gap 37 between the field plate 29 and the p⁻ type body layer 15 and the n⁺ type source layer 14 thereon. The thickness (width) $t_4$ of the clearance gap 37 may be at the same level as the thickness $t_5$ of the insulating film 28. The field plate 29 is opposed to a part of the p⁻ type body layer 15 via the clearance gap 37, while being opposed to another part of the p⁻ type body layer 15 and the n⁻ type drain layer 16 via the insulating film 28. The field plate 29 may also have an upper surface at a position lower than that of the upper surface of the gate electrode 18 with respect to the surface of the semiconductor substrate 2. The upper surface of the field plate 29 may be positioned, for example, lower than the boundary between the n⁺ type source layer 14 and the p⁻ type body layer 15 or at an intermediate thickness of the p⁻ type body layer 15.

The bottom of the clearance gap 37 is at an intermediate position of the p⁻ type body layer 15 in the depth direction of the field plate trench 12. This allows a source contact 63 (to be described hereinafter), when entering into the clearance gap 37, to be connected reliably to the p⁻ type body layer 15 so that the p⁻ type body layer 15 and the source metal 4 can be electrically connected. On the other hand, since the contact between the source contact 63 and the n⁻ type drain layer 16 is inhibited, the n⁻ type drain layer 16 and the source metal 4 can be prevented from a short circuit.

In this preferred embodiment, an embedded field plate 32, as an example of a lower field plate according to the present invention, is embedded below the field plate 29 in the field plate trench 12. The embedded field plate 32 and the field plate 29 are insulated and separated vertically with the bottom 30 of the insulating film 28 therebetween. The embedded field plate 32 is composed of, for example, polysilicon. A line insulating film 34 composed of, for example, silicon oxide is also interposed between the embedded field plate 32 and the inner surface of the field plate trench 12. The line insulating film 34 is formed along the inner surface of the field plate trench 12 and, at the upper end thereof, integrated with the insulating film 28. The embedded field plate 32 may be covered with the bottom (30) of the insulating film 28 and the line insulating film 34 to be floated electrically with respect to the outside or have the same potential (ground potential) as the source metal 4. It is noted that in this preferred embodiment, the insulating film 28 and the line insulating film 34 are provided together as an example of a second insulating film according to the present invention.

The line insulating film 34 may include a first portion 35 and a second portion 36 with a film elaborateness lower than that of the first portion 35 from the inner surface of the field plate trench 12 in the film thickness direction. It is noted that the gate insulating film 17 and the insulating film 28 are formed in the same step and also the line insulating film 23 and the line insulating film 34 are formed in the same step, as will be described hereinafter. The gate insulating film 17 and the insulating film 28 thus have approximately the same configuration and also the line insulating film 23 and the line insulating film 34 have approximately the same configuration. Accordingly, the configuration of the first portion 35 and the second portion 36 and the film thickness of the insulating film 28 and that of the line insulating film 34 will not be described specifically, with each component of the gate insulating film 17 and the line insulating film 23 in FIG. 3 designated by an additional reference in parentheses.

A p⁻⁻ type layer 38 is formed on the inner surface of the field plate trench 12 in the n⁻ type drain layer 16. The p⁻⁻ type layer 38 is connected, at an upper portion thereof, electrically to the p⁻ type body layer 15 (p⁺ type body contact layer 40 to be described hereinafter) and, from the connection position, may be formed on the entire inner surface (including the side surface and the bottom surface) of the field plate trench 12. This causes a body diode 39 to be defined by the pn junction between the p⁻⁻ type layer 38 and the n⁻ type drain layer 16 underneath the field plate trench 12 in the semiconductor substrate 2. It is noted that the body diode in the semiconductor substrate 2 may be formed by the pn junction between the p⁻ type body layer 15 and the n⁻ type drain layer 16. The impurity concentration of the p⁻⁻ type layer 38 may also be, for example, $1 \times 10^{19}$ cm⁻³ to $1 \times 10^{21}$ cm⁻³.

A p⁺ type body contact layer 40 is formed on the inner surface of the field plate trench 12 in the p⁻ type body layer 15. The p⁺ type body contact layer 40 spans the clearance gap 37 and the insulating film 28 along the side surface of the field plate trench 12. The impurity concentration of the p⁺ type body contact layer 40 may be, for example, $1 \times 10^{20}$ cm⁻³ to $1 \times 10^{22}$ cm⁻³.

An interlayer insulating film 41 is formed on the semiconductor substrate 2. The interlayer insulating film 41 may include a silicon nitride film 42 on the lower side and a silicon oxide film 43 on the upper side. The interlayer insulating film 41 enters into a recessed portion 44 defined by the height difference between the upper surface of the gate electrode 18 and the surface of the semiconductor substrate 2. A contact hole 45 for exposure of the field plate trench 12 therethrough is also defined in the interlayer insulating film 41.

The source metal 4 is formed on the interlayer insulating film 41. The source metal 4 is connected to a source contact 63 embedded in the contact hole 45. The source metal 4 and the source contact 63 may be referred to collectively as a source electrode 20. The source contact 63 is composed of, for example, a tungsten (W) plug and enters into the exposed field plate trench 12. The source contact 63 within the field plate trench 12 is electrically connected to the p⁺ type body contact layer 40 via the clearance gap 37. Thus, using the metal (W in this preferred embodiment) more embeddable than the metal (Al in this preferred embodiment) on the interlayer insulating film 41, the portion of the source electrode 20 within the contact hole 45 can also be embedded successfully in a relatively narrowed space such as the clearance gap 37.

On the other hand, a recessed portion 46 is also defined in the field plate trench 12 by the height difference between the upper surface of the field plate 29 and the surface of the semiconductor substrate 2, as is the case with the gate trenches 11. The recessed portion 46 may be defined in a self-aligned manner with respect to the contact hole 45. This may cause the recessed portion 46 to have a side surface 64 that smoothly continues into the inner surface of the contact hole 45 with no step. The side surface 64 may have a first surface 65 tapered with a diameter reduced, for example, from the opening end portion to an intermediate thickness of the n⁺ type source layer 14 and, in a portion deeper than the first surface 65, a second surface 66 having approximately the same width as the bottom of the field plate trench 12. The source contact 63 is in collective contact with the n⁺ type source layer 14 on either side via the side surface 64 of the recessed portion 46. On the other hand, the bottom of the recessed portion 46 is formed by the upper surface of the field plate 29 and the clearance gap 37.

Figure 4:
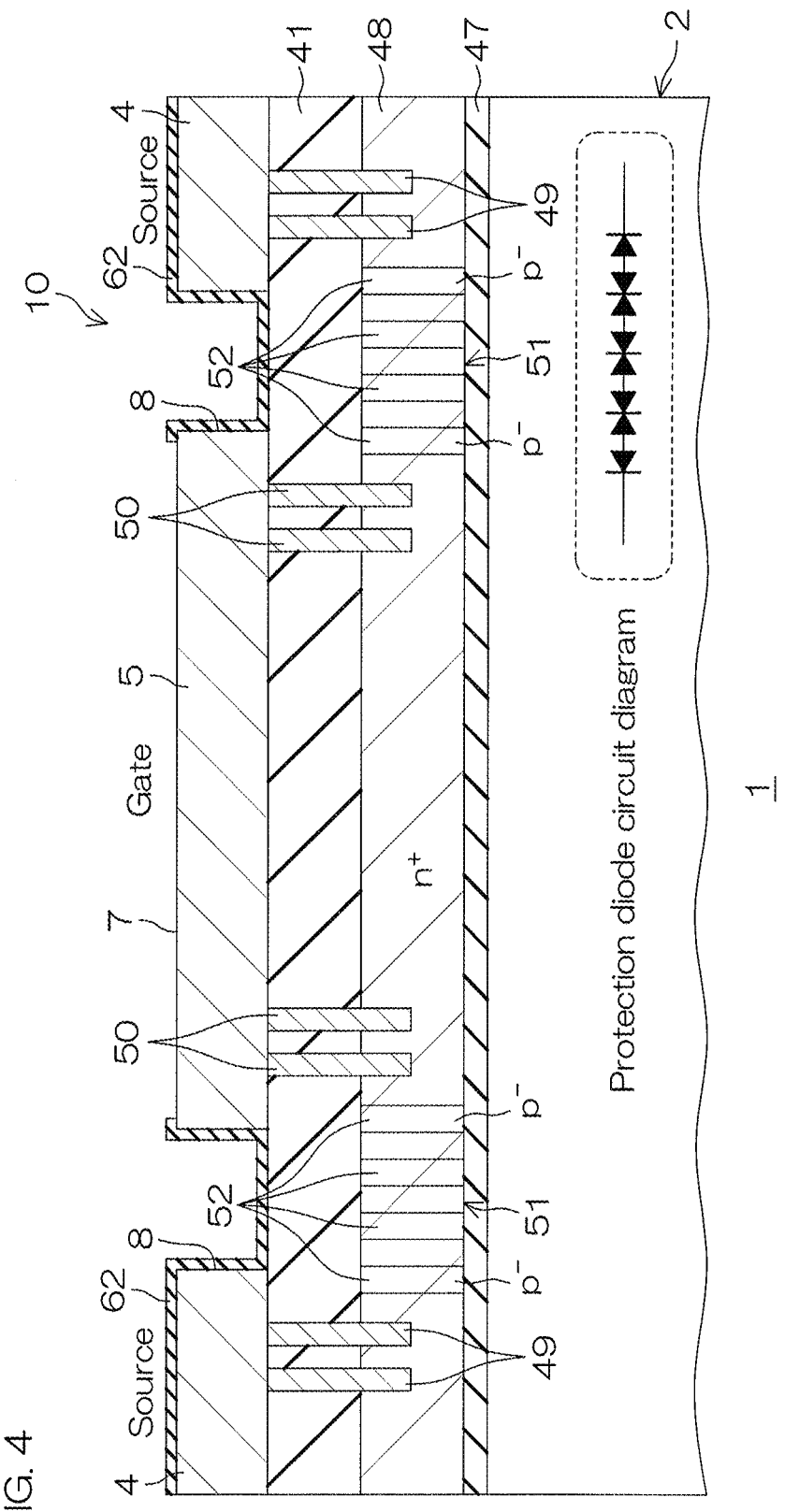
FIG. 4 is a cross-sectional view (taken along line B-B) of the semiconductor device shown in FIG. 1.

FIG. 4 is a cross-sectional view (taken along line B-B) of the semiconductor device 1 shown in FIG. 1, showing the cross-section of the non-active region 10. FIG. 5 is a circuit diagram of the semiconductor device 1.

An insulating film 47 is formed on the semiconductor substrate 2 in the non-active region 10. The insulating film 47 is composed of, for example, silicon oxide. The insulating film 47 may be formed by an extended portion of the gate insulating film 17 shown in FIG. 2, that is, may be formed in the same step as the gate insulating film 17.

An $n^+$ type semiconductor film 48 is formed on the insulating film 47. The $n^+$ type semiconductor film 48 is composed of, for example, $n^+$ type polysilicon. The $n^+$ type semiconductor film 48 may be formed by an extended portion of the gate electrode 18 shown in FIG. 2, that is, may be formed in the same step as the gate electrode 18. The $n^+$ type semiconductor film 48 spans and opposed to the source metal 4 and the gate metal 5 via the boundary portion 8.

An interlayer insulating film 41 is formed on the semiconductor substrate 2 so as to cover the $n^+$ type semiconductor film 48. The source metal 4 and the gate metal 5 are electrically connected to the $n^+$ type semiconductor film 48, respectively, with contacts 49, 50 passing through the interlayer insulating film 41. The contacts 49, 50 may each include one or more contacts. The contacts 49, 50 may be composed of, for example, a tungsten (W) plug formed in the same step as the source contact 63 shown in FIG. 2.

A protection diode 51 is defined in the $n^+$ type semiconductor film 48. The protection diode 51 is formed by a bidirectional diode, which is defined, for example, by arranging a plurality of $p^+$ type regions 52 in a spaced manner in the $n^+$ type semiconductor film 48. This causes $n^+$ type regions (part of the $n^+$ type semiconductor film 48) and the $p^+$ type regions 52 to be arranged horizontally and alternately in the region where the protection diode 51 is defined.

The protection diode 51 is arranged in a region below the boundary portion 8 between the contacts 49 and 50. This causes the contacts 49 and 50 to be separated by the protection diode 51 (bidirectional diode) and thereby a short circuit is prevented in a normal state. The circuit diagram in FIG. 5 then shows a relationship of electrical connection in the semiconductor device 1 including the protection diode 51.

Next, a method for manufacturing the semiconductor device 1 will be described.

FIGS. 6A to 6L each illustrate a part of a process of manufacturing the semiconductor device 1 according to its process sequence.

Figure 6A:
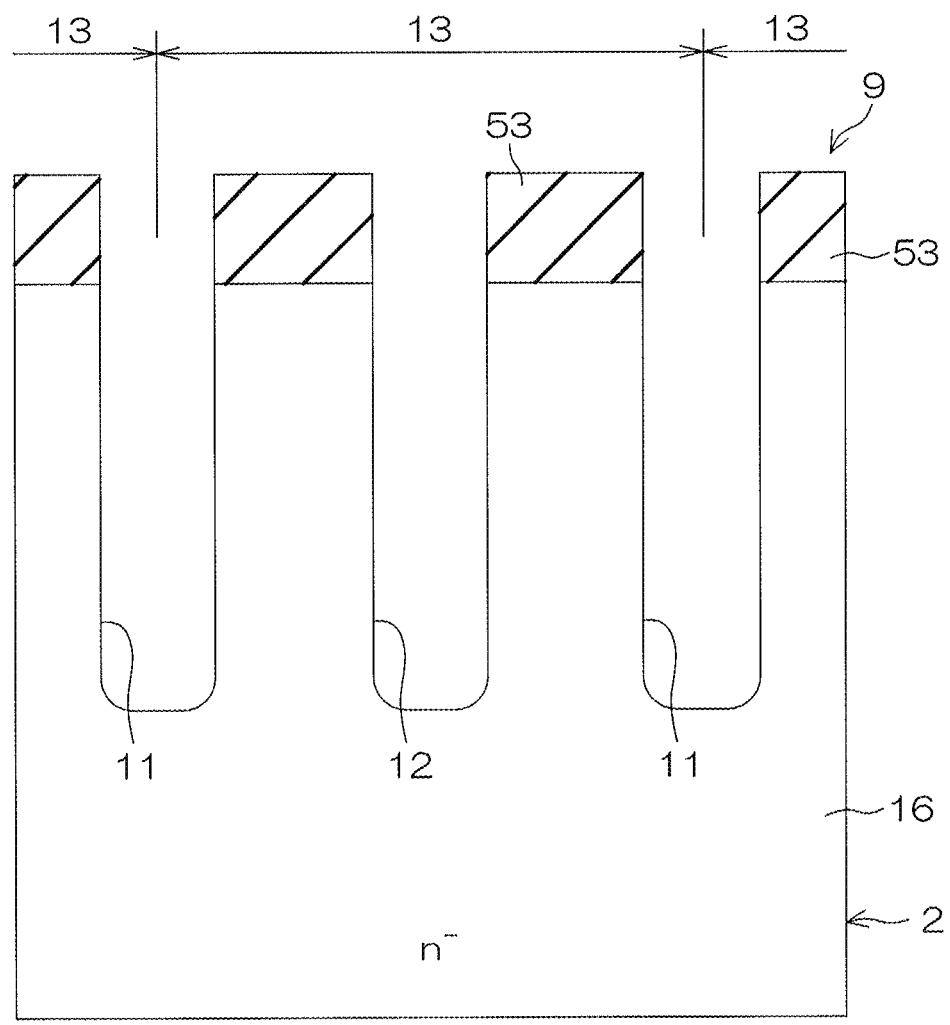
FIG. 6A illustrates a part of a process of manufacturing the semiconductor device.

In order to manufacture the semiconductor device 1, a semiconductor substrate 2 in a wafer state, for example, is provided as shown in FIG. 6A. The semiconductor substrate 2 is an $n^-$ type silicon substrate, in which an $n^-$ type drain layer 16 of the semiconductor device 1 is defined. The semiconductor substrate 2 is then etched selectively via a hard mask 53 composed of silicon oxide. This causes gate trenches 11 and a field plate trench 12 to be defined simultaneously in the semiconductor substrate 2 and a unit cell 13 to be laid out.

Figure 6B:
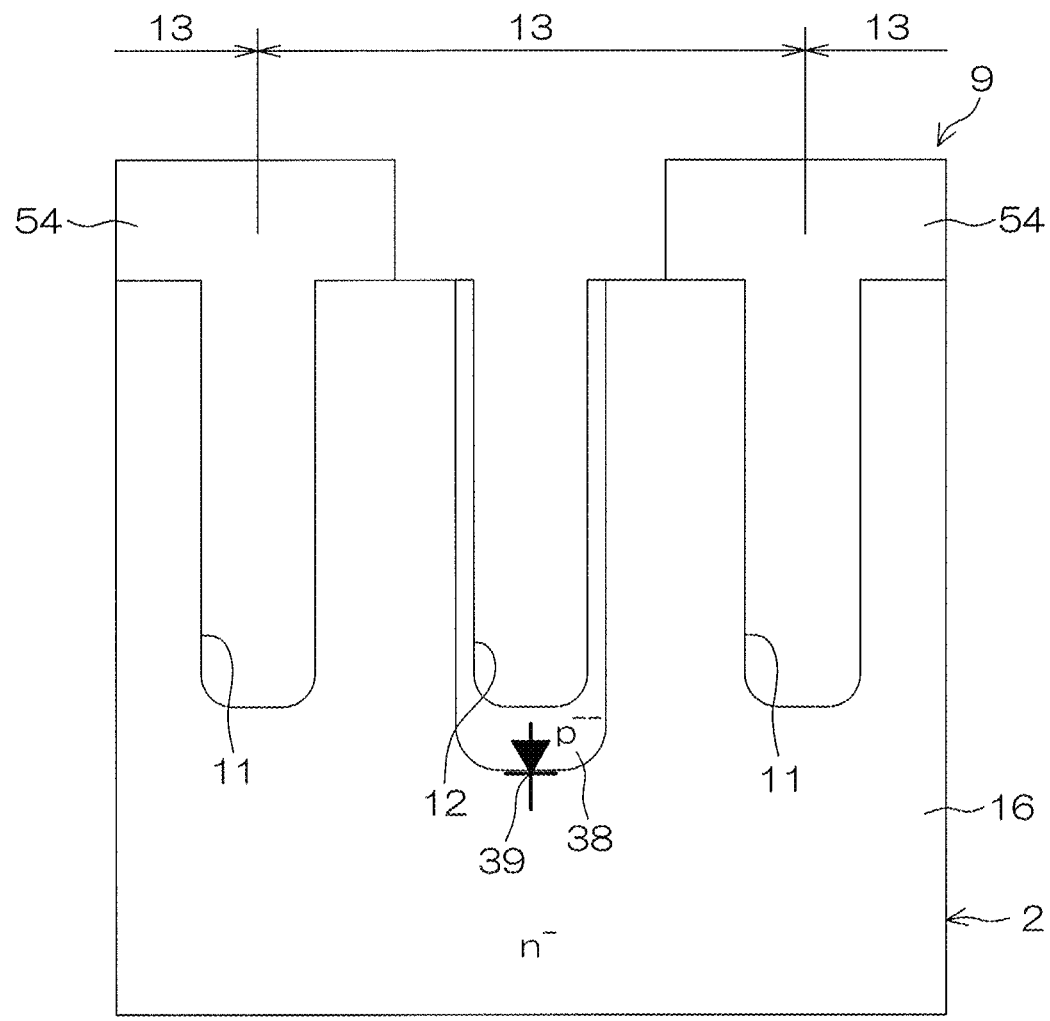
FIG. 6B illustrates a step following that shown in FIG. 6A.

Next, as shown in FIG. 6B, after removing the hard mask 53, a mask 54 (e.g. resist film) is formed so as to cover the gate trenches 11. Via the mask 54, p type impurity ions are injected into the inner surface of the field plate trench 12. This causes a $p^{--}$ type layer 38 to be defined. The p type impurity ions may include, for example, B (boron), Al (aluminum), etc.

Figure 6C:
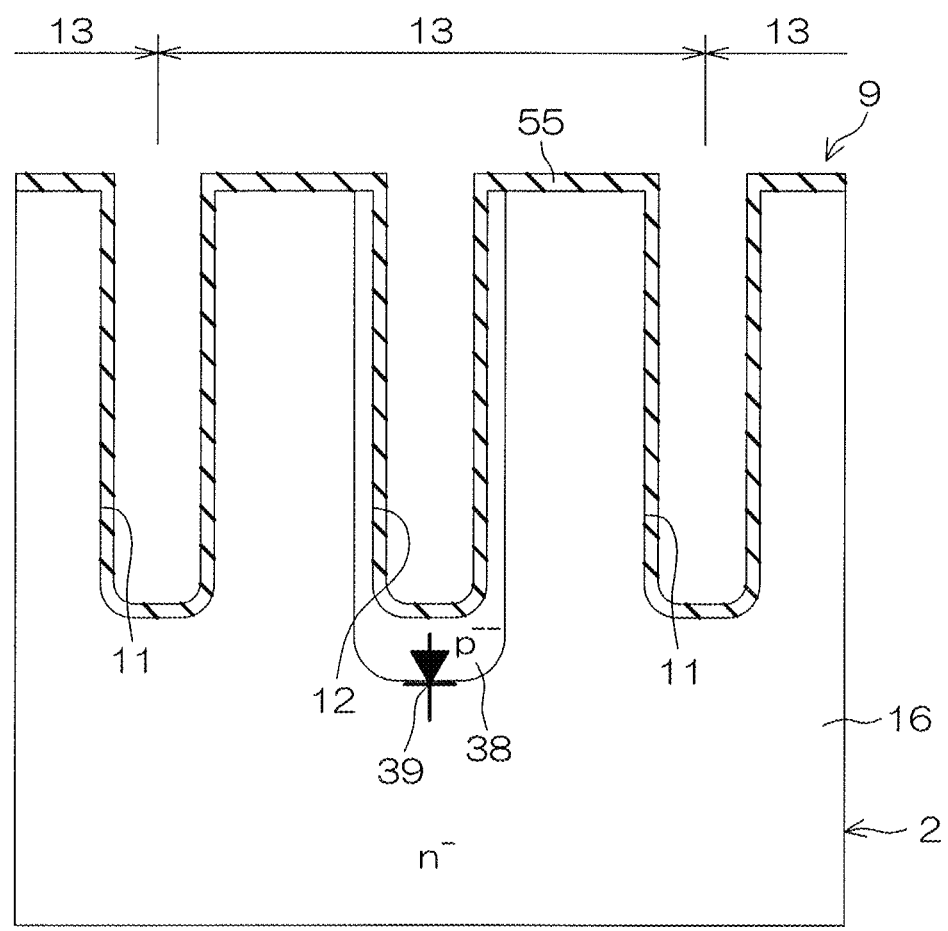
FIG. 6C illustrates a step following that shown in FIG. 6B.

Next, as shown in FIG. 6C, the semiconductor substrate 2 is thermally processed so that a thermal oxidation film 55 is formed on the inner surfaces of the gate trenches 11 and the field plate trench 12 and the surface of the semiconductor substrate 2. The thermal oxidation film 55 may have a thickness of, for example, 400 Å to 800 Å. The thermal oxidation film 55 has a relatively high elaborateness and mainly forms the first portion 24 of the line insulating film 23 and the first portion 35 of the line insulating film 34 shown in FIG. 3.

Figure 6D:
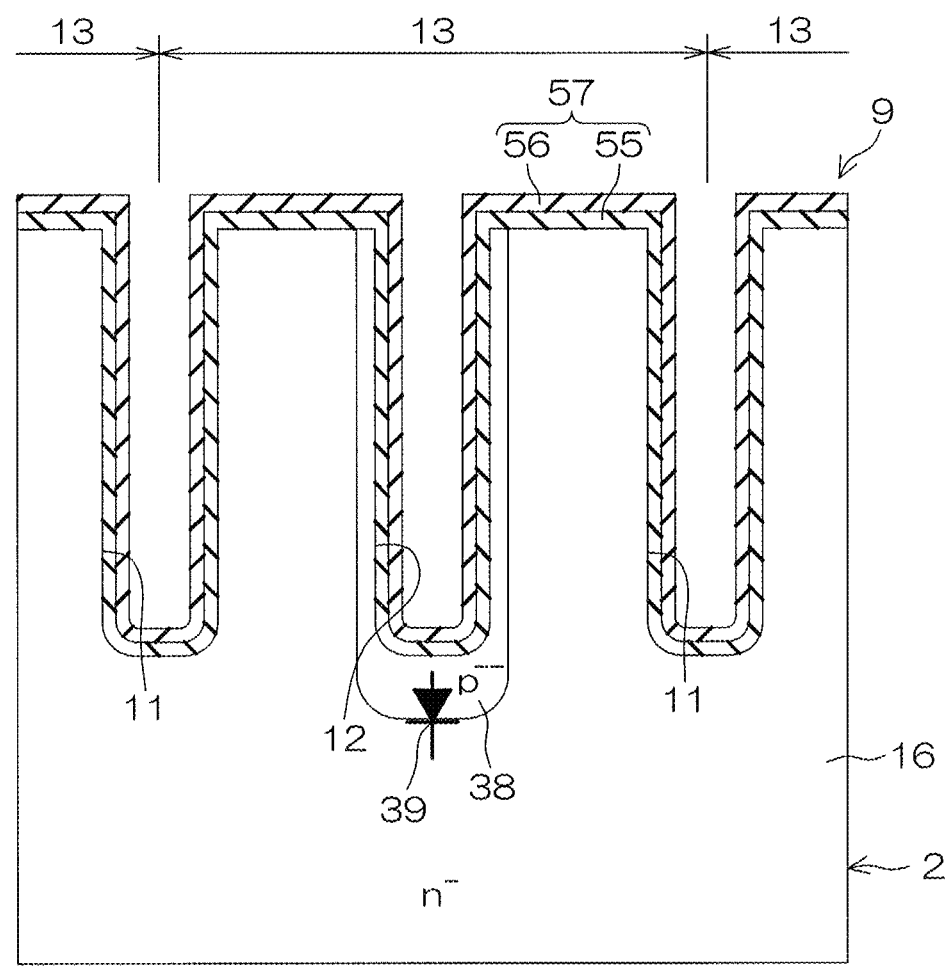
FIG. 6D illustrates a step following that shown in FIG. 6C.

Next, as shown in FIG. 6D, silicon oxide is deposited on the thermal oxidation film 55 by a CVD (Chemical Vapor Deposition) method or a PVD (Physical Vapor Deposition) method. This causes a deposition insulating film 56 to be formed on the thermal oxidation film 55. The deposition insulating film 56 may have a thickness of, for example, 200 Å to 500 Å. The deposition insulating film 56 has an elaborateness lower than that of the thermal oxidation film 55 and mainly forms the second portion 25 of the line insulating film 23 and the second portion 36 of the line insulating film 34 shown in FIG. 3. The formation of the deposition insulating film 56 causes the inner surfaces of the gate trenches 11 and the field plate trench 12 to be covered with a layered insulating film 57 composed of the thermal oxidation film 55 and the deposition insulating film 56. It is noted that in FIG. 6E and the following figures, the thermal oxidation film 55 and the deposition insulating film 56 are not shown, but integrated as the insulating film 57 for description.

Figure 6E:
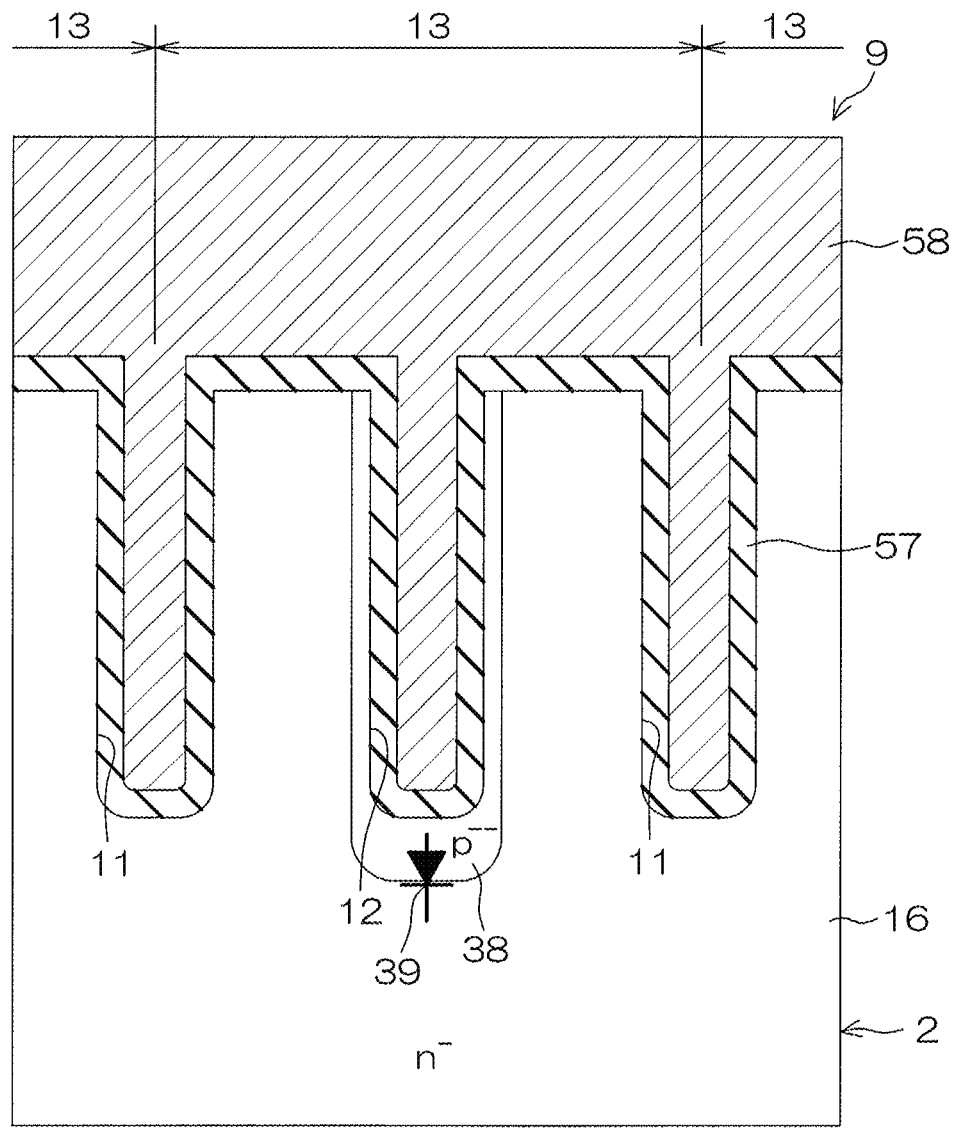
FIG. 6E illustrates a step following that shown in FIG. 6D.

Next, as shown in FIG. 6E, an electrode material 58 composed of polysilicon is deposited on the semiconductor substrate 2. The electrode material 58 in turn fills in the gate trenches 11 and the field plate trench 12 completely and covers the surface of the semiconductor substrate 2. Thereafter, n type impurity ions are injected into the electrode material 58 and diffused (driven-in) through thermal processing. Then type impurity ions may include, for example, P (phosphorus), As (arsenic), etc.

Figure 6F:
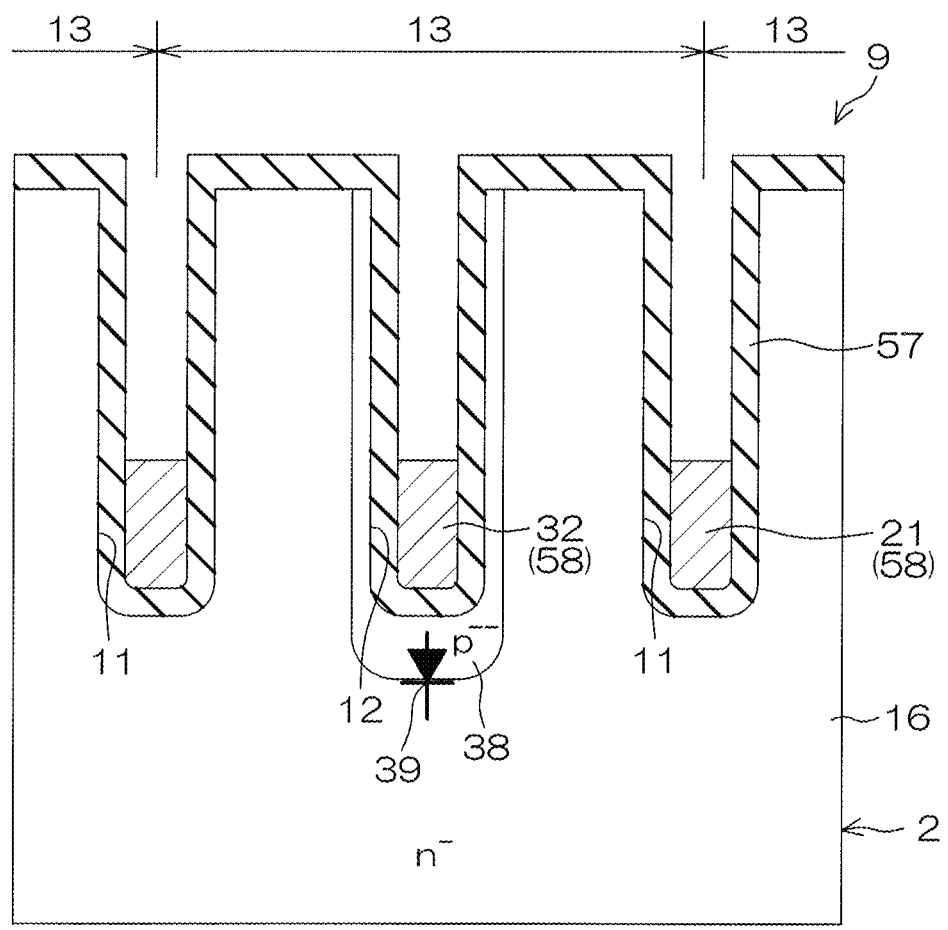
FIG. 6F illustrates a step following that shown in FIG. 6E.

Next, as shown in FIG. 6F, the electrode material 58 is etched. The electrode material 58 continues to be etched until the etching surface reaches an intermediate depth in the gate trenches 11 and the field plate trench 12. As a result, the residual electrode material 58 is defined as embedded electrodes 21 and an embedded field plate 32, respectively, in the gate trenches 11 and the field plate trench 12.

Figure 6G:
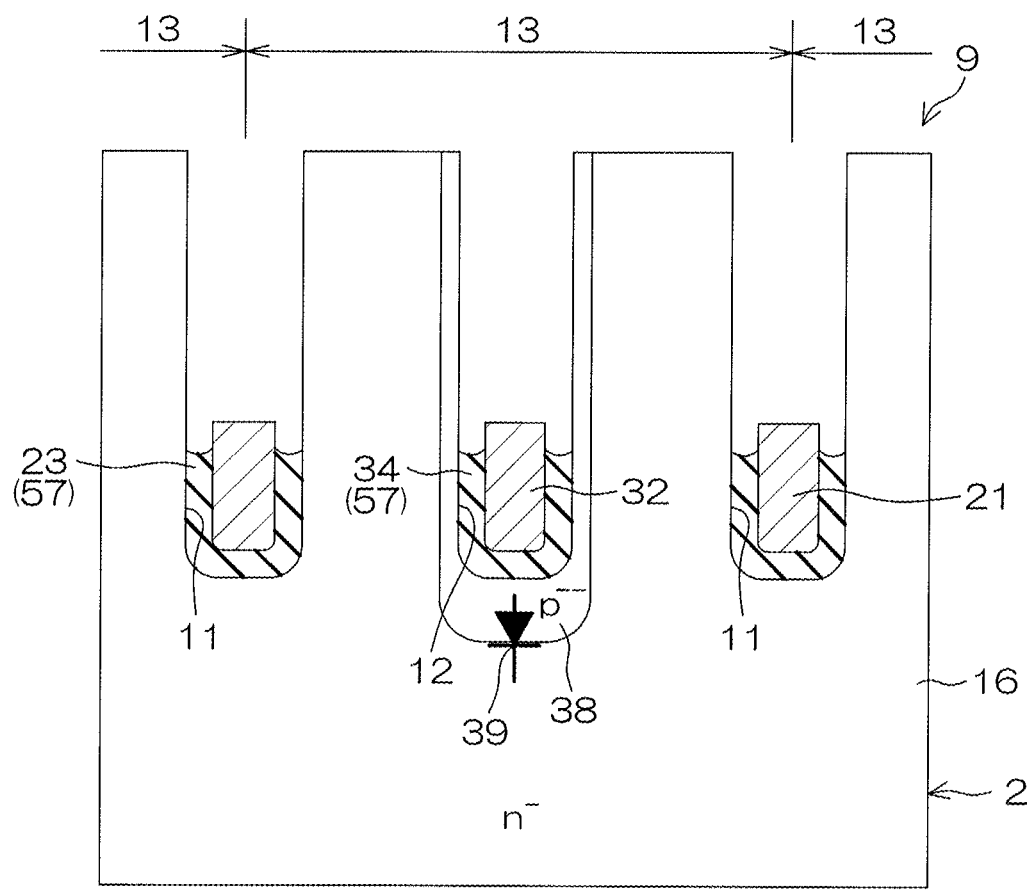
FIG. 6G illustrates a step following that shown in FIG. 6F.

Next, as shown in FIG. 6G, the insulating film 57 is etched. The insulating film 57 continues to be etched until the insulating film 57 above the embedded electrodes 21 and the embedded field plate 32 is removed and the etching surface reaches the vicinity of the upper surfaces of the embedded electrodes 21 and the embedded field plate 32. As a result, the residual electrode material 57 is defined as line insulating films 23 and a line insulating film 34, respectively, in the gate trenches 11 and the field plate trench 12.

Figure 6H:
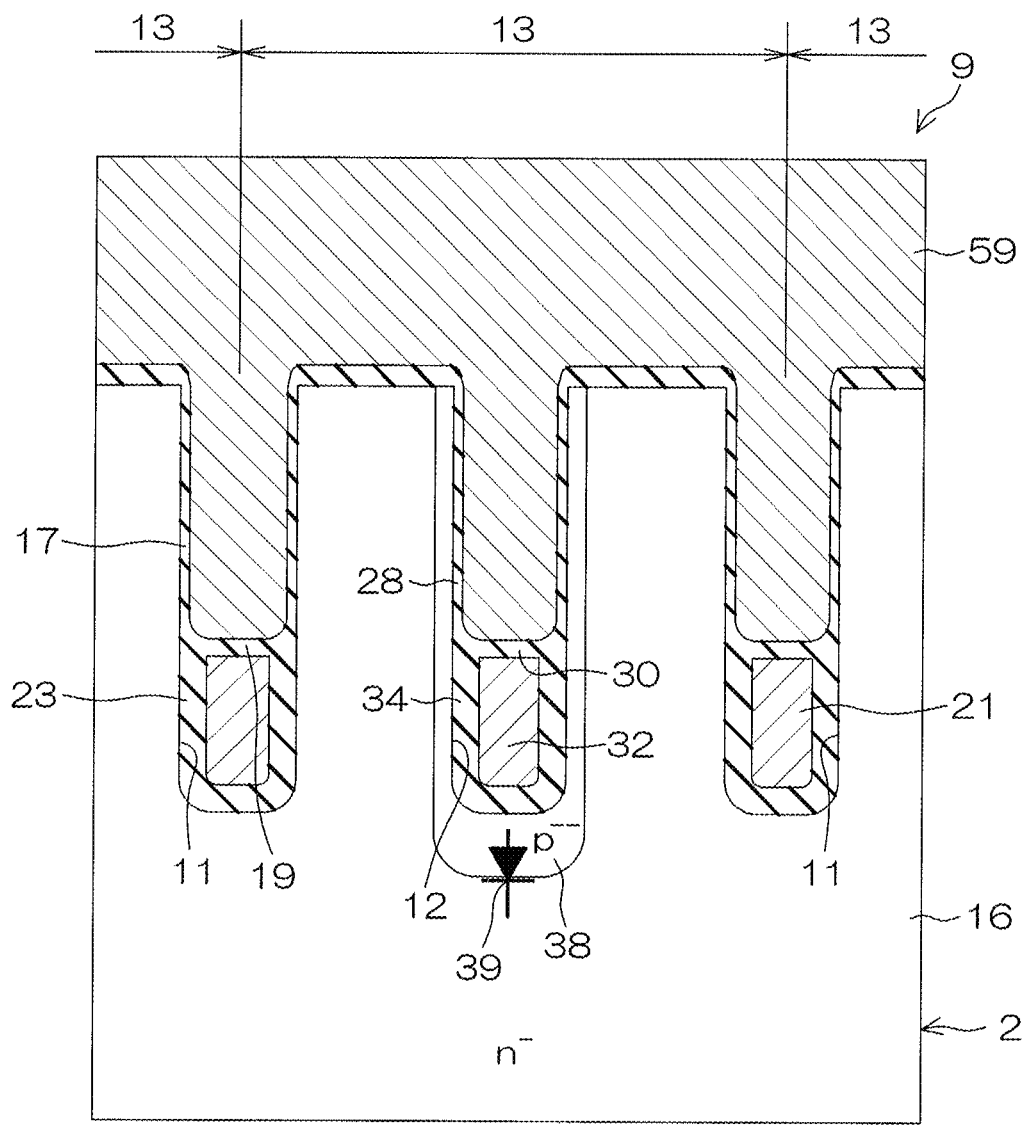
FIG. 6H illustrates a step following that shown in FIG. 6G.

Next, as shown in FIG. 6H, the semiconductor substrate 2 is thermally processed so that a thermal oxidation film is formed on the exposed side surfaces of the gate trenches 11 and the field plate trench 12 and the surface of the semiconductor substrate 2 exposed through etching of the insulating film 57. Upon this, the upper surfaces of the embedded electrodes 21 and the embedded field plate 32 are also oxidized and formed with a thermal oxidation film. This causes a gate insulating film 17 and an insulating film 28 to be defined. The oxidized portions on the upper surfaces of the embedded electrodes 21 and the embedded field plate 32 serve, respectively, as the bottom 19 of the gate insulating film 17 and the bottom 30 of the insulating film 28. It is noted that the insulating film 47 shown in FIG. 4 may be formed in this thermal oxidation step.

Next, as shown in FIG. 6H, an electrode material 59 of polysilicon is deposited on the semiconductor substrate 2. The electrode material 59 in turn fills in the gate trenches 11 and the field plate trench 12 completely and covers the surface of the semiconductor substrate 2. Thereafter, n type impurity ions are injected into the electrode material 59 and diffused (driven-in) through thermal processing. The $n^+$ type semiconductor film 48 shown in FIG. 4 may be formed in this step.

Figure 6I:
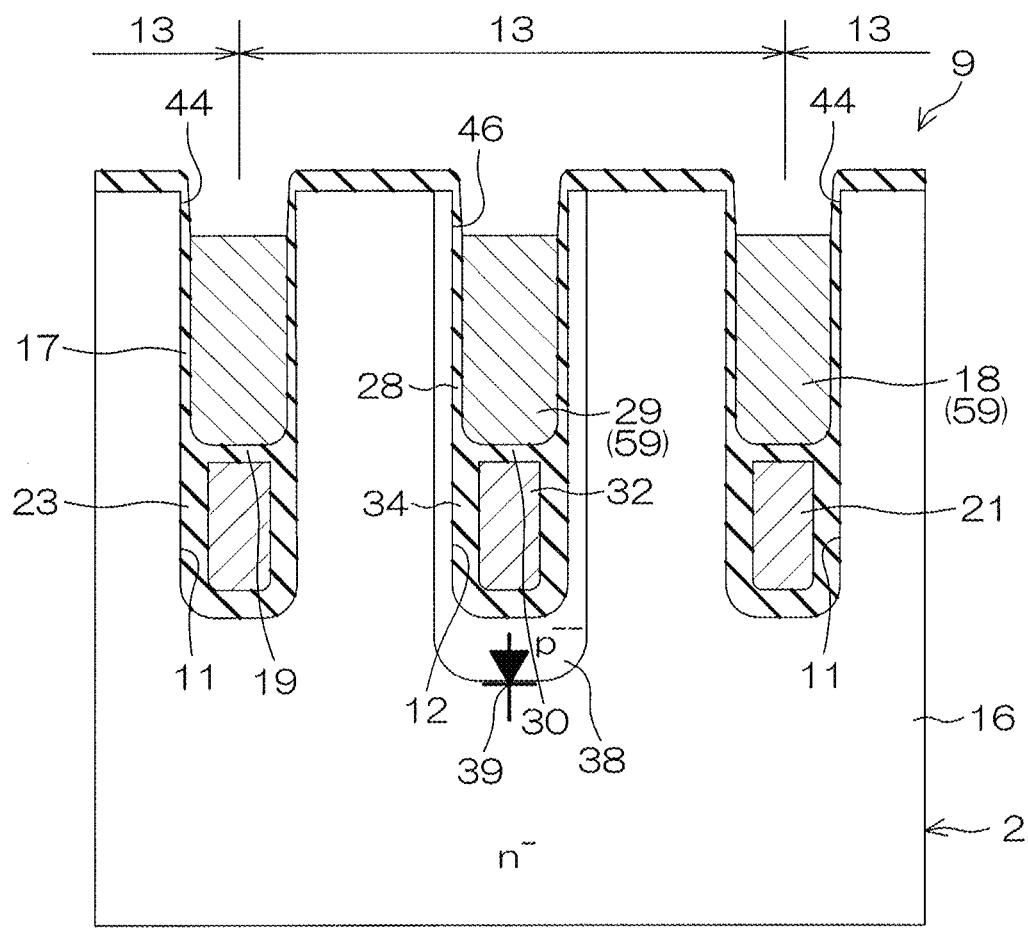
FIG. 6I illustrates a step following that shown in FIG. 6H.

Next, as shown in FIG. 6I, the electrode material 59 is etched. The electrode material 59 continues to be etched until the etching surface reaches a position in the gate trenches 11 and the field plate trench 12 slightly lower than the surface of the semiconductor substrate 2. As a result, the residual electrode material 59 is defined as gate electrodes 18 and a field plate 29, respectively, in the gate trenches 11 and the field plate trench 12. Recessed portions 44, 46 are also defined thereon.

Figure 6J:
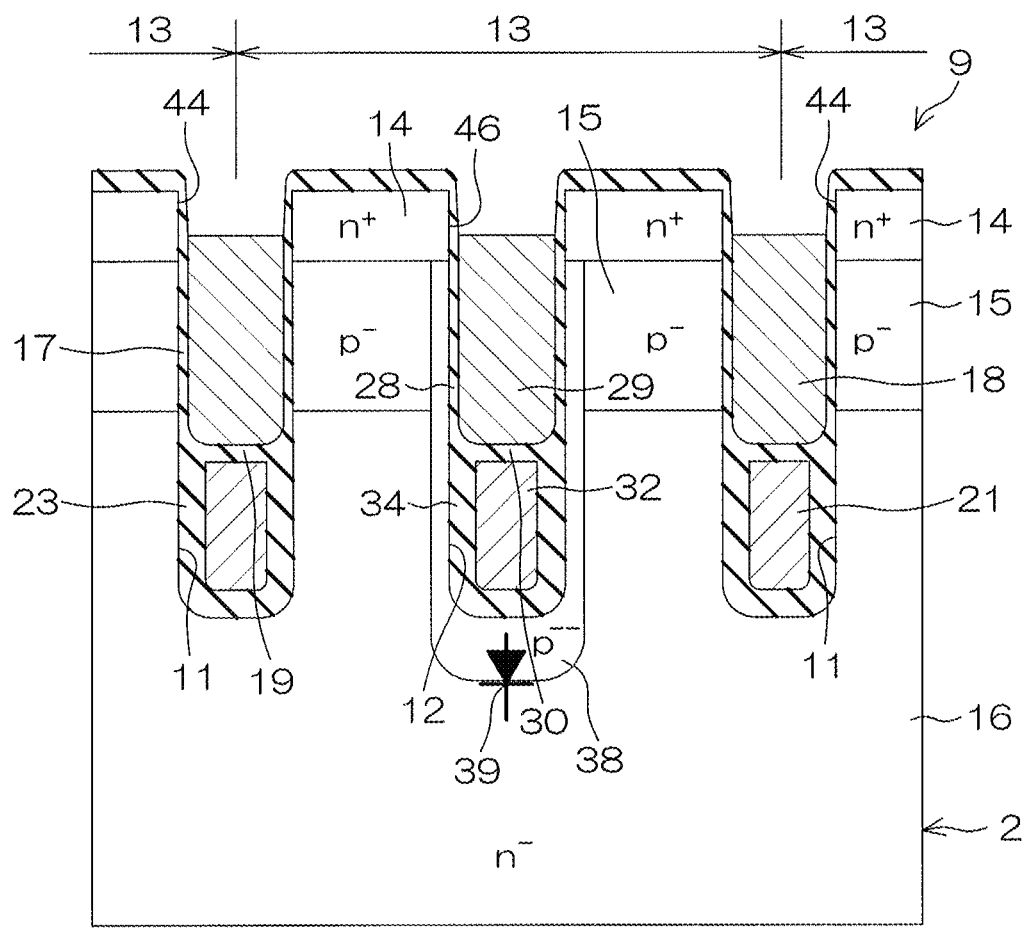
FIG. 6J illustrates a step following that shown in FIG. 6I.

Next, as shown in FIG. 6J, n type impurities and p type impurities are injected sequentially into the semiconductor substrate 2. Thereafter, the injected impurity ions are diffused (driven-in) through thermal processing. This causes an $n^+$ type source layer 14 and a $p^-$ type body layer 15 to be defined.

Figure 6K:
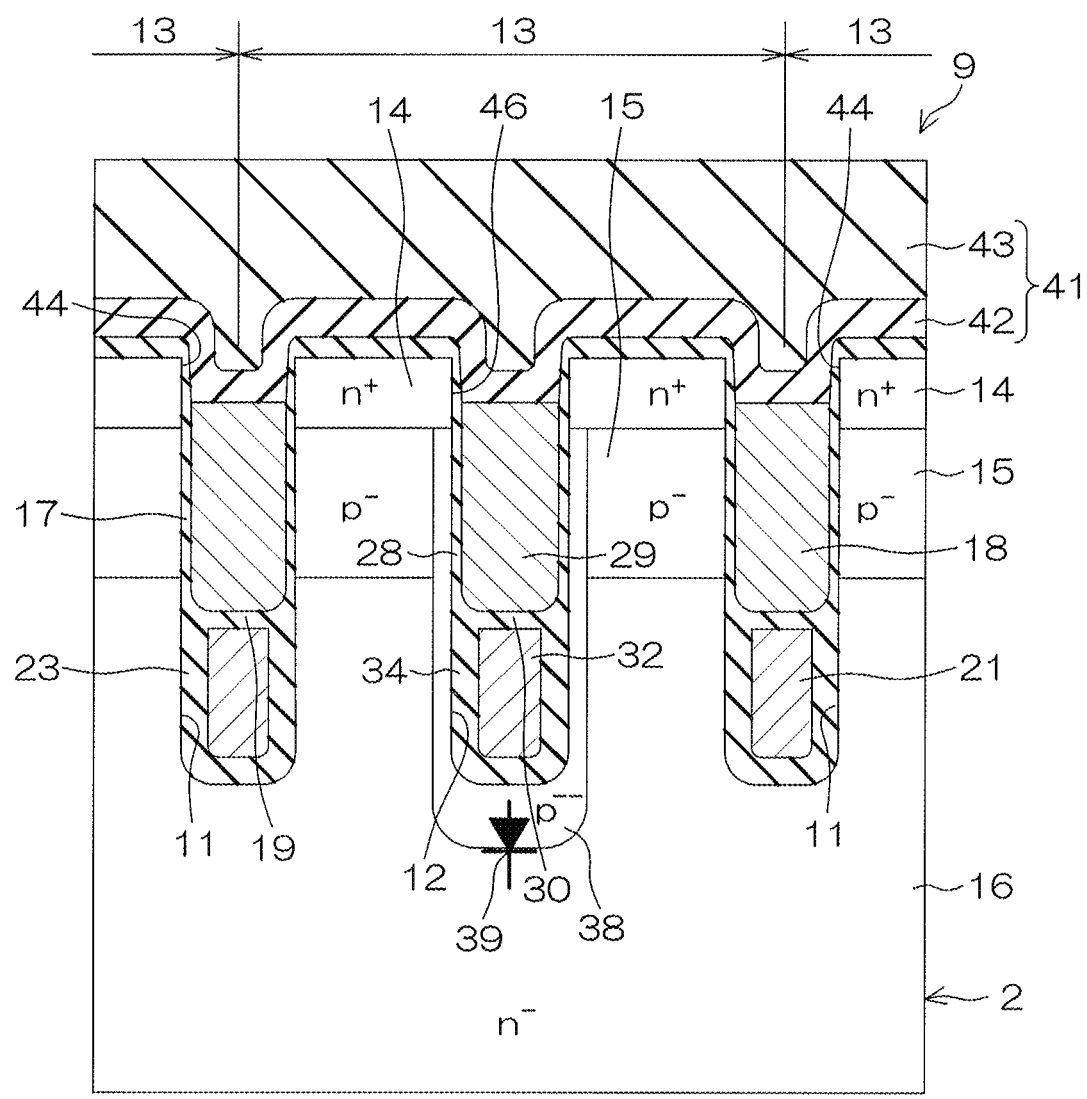
FIG. 6K illustrates a step following that shown in FIG. 6J.

Next, as shown in FIG. 6K, a silicon nitride film 42 and a silicon oxide film 43 are deposited sequentially by, for example, a CVD method. This causes an interlayer insulating film 41 to be defined.

Figure 6L:
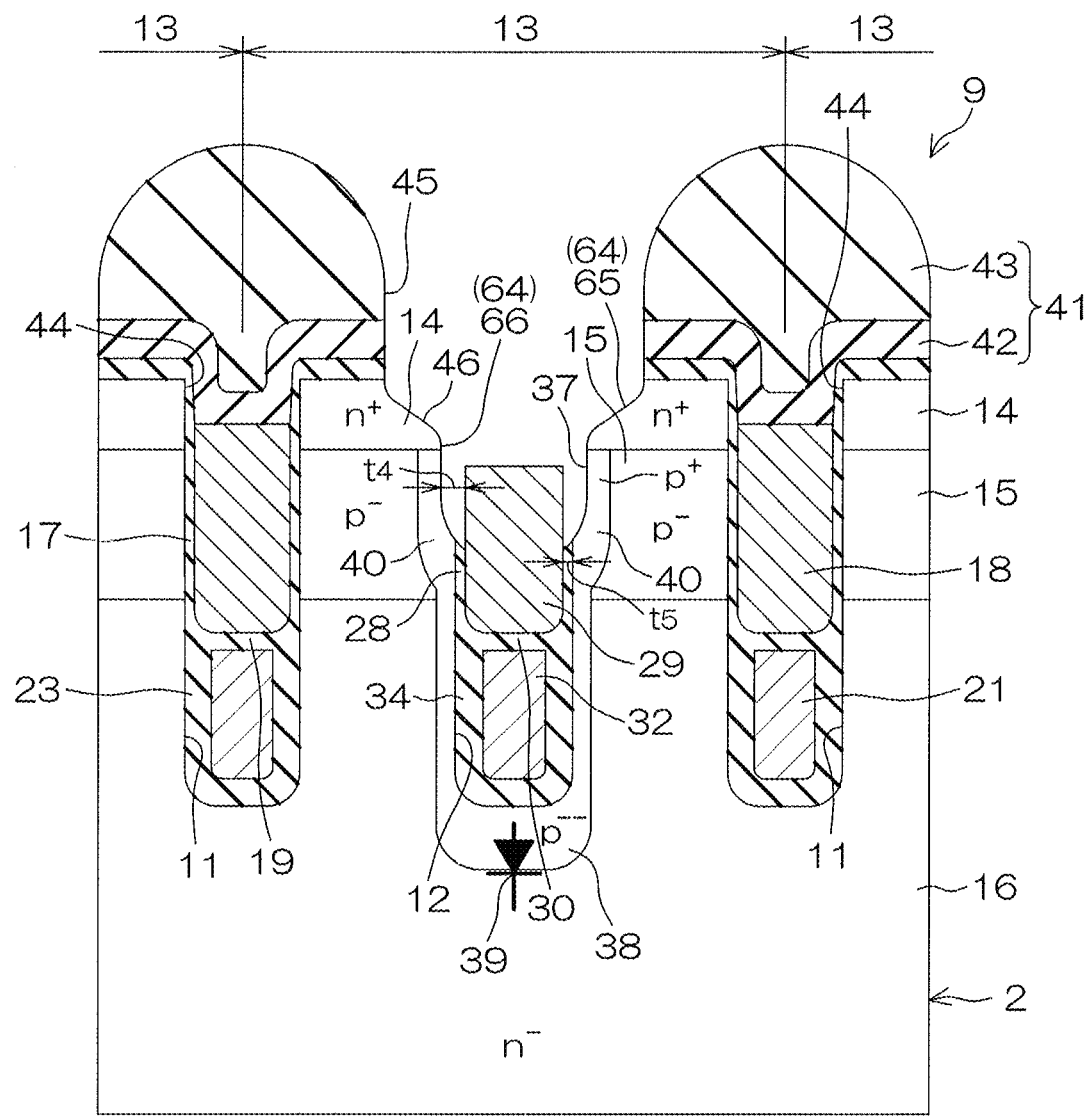
FIG. 6L illustrates a step following that shown in FIG. 6K.

Next, as shown in FIG. 6L, the interlayer insulating film 41 and the insulating film 28 are etched through, for example, reactive ion etching (RIE). This causes a contact hole 45 to be defined and a clearance gap 37 to be defined therebelow. Etching gas is used having etching selectivity for the field plate 29 (polysilicon) and the semiconductor substrate 2 (silicon). For example, the interlayer insulating film 41 and the insulating film 28 may be etched through reactive ion etching (RIE). This causes the insulating film 28 to be etched progressively and selectively, whereby the clearance gap 37 can be defined successfully between the field plate 29 and the semiconductor substrate 2 while the etching of the field plate 29 and the semiconductor substrate 2 is controlled. Employing reactive ion etching also allows the insulating film 28, which is a thin etching target, to be etched deeply and successfully.

The clearance gap 37 is defined in a portion where a part of the insulating film 28 is removed through etching, to have a thickness $t_4$ the same level as the thickness $t_5$ of the insulating film 28. However, since the semiconductor substrate 2 is also etched slightly during the etching, though at an etching rate lower than that for the insulating film 28, the thickness $t_4$ of the clearance gap 37 is substantially a little greater than the thickness $t_5$ of the insulating film 28.

During the etching, since the $n^+$ type source layer 14 is etched little by little from the side surface of the recessed portion 46 and the field plate 29 is etched little by little from the upper surface thereof, the side surface 64 of the recessed portion 46 is formed to include a tapered surface (first surface 65) and the position of the upper surface of the field plate 29 is lowered.

Next, as shown in FIG. 6L, p type impurity ions are injected into a region on the semiconductor substrate 2. Within the field plate trench 12, p type impurity ions are injected into the $p^-$ type body layer 15 via the clearance gap 37. This causes a $p^+$ type body contact layer 40 to be defined.

Thereafter, a source contact 63 is embedded in the contact hole 45 and then an electrode film 3 is formed so as to cover the region on the semiconductor substrate 2 and patterned, whereby a source metal 4 and a gate metal 5 are defined. The source metal 4 is electrically connected to the $p^+$ type body contact layer 40 via the source contact 63 entering into the clearance gap 37. Through the foregoing steps, the semiconductor device 1 shown in FIGS. 1 to 4 can be achieved.

Next, an operational effect of the semiconductor device 1 will be described.

Figure 7A:
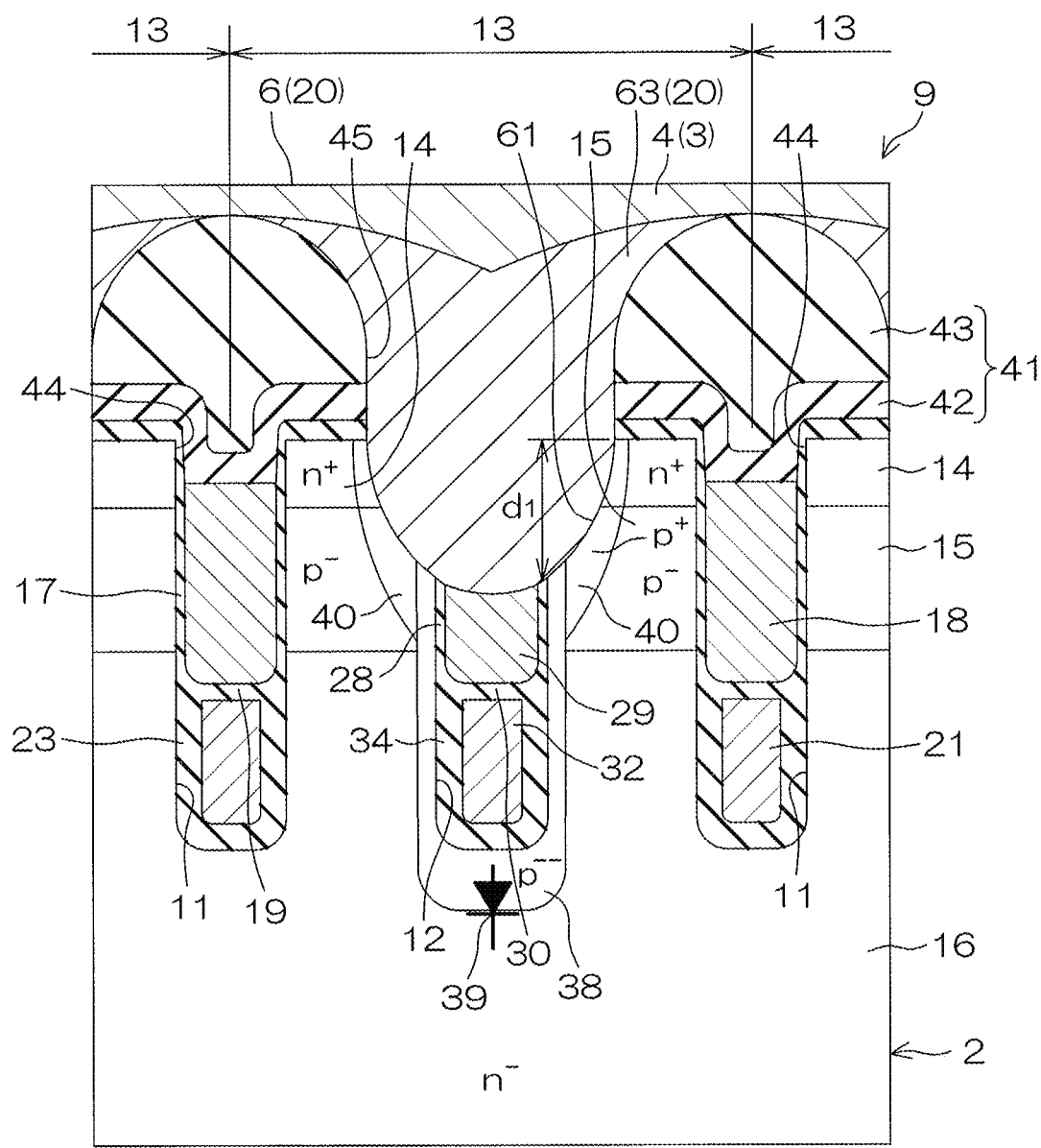
FIG. 7A illustrates a second structure of the semiconductor device.
Figure 7B:
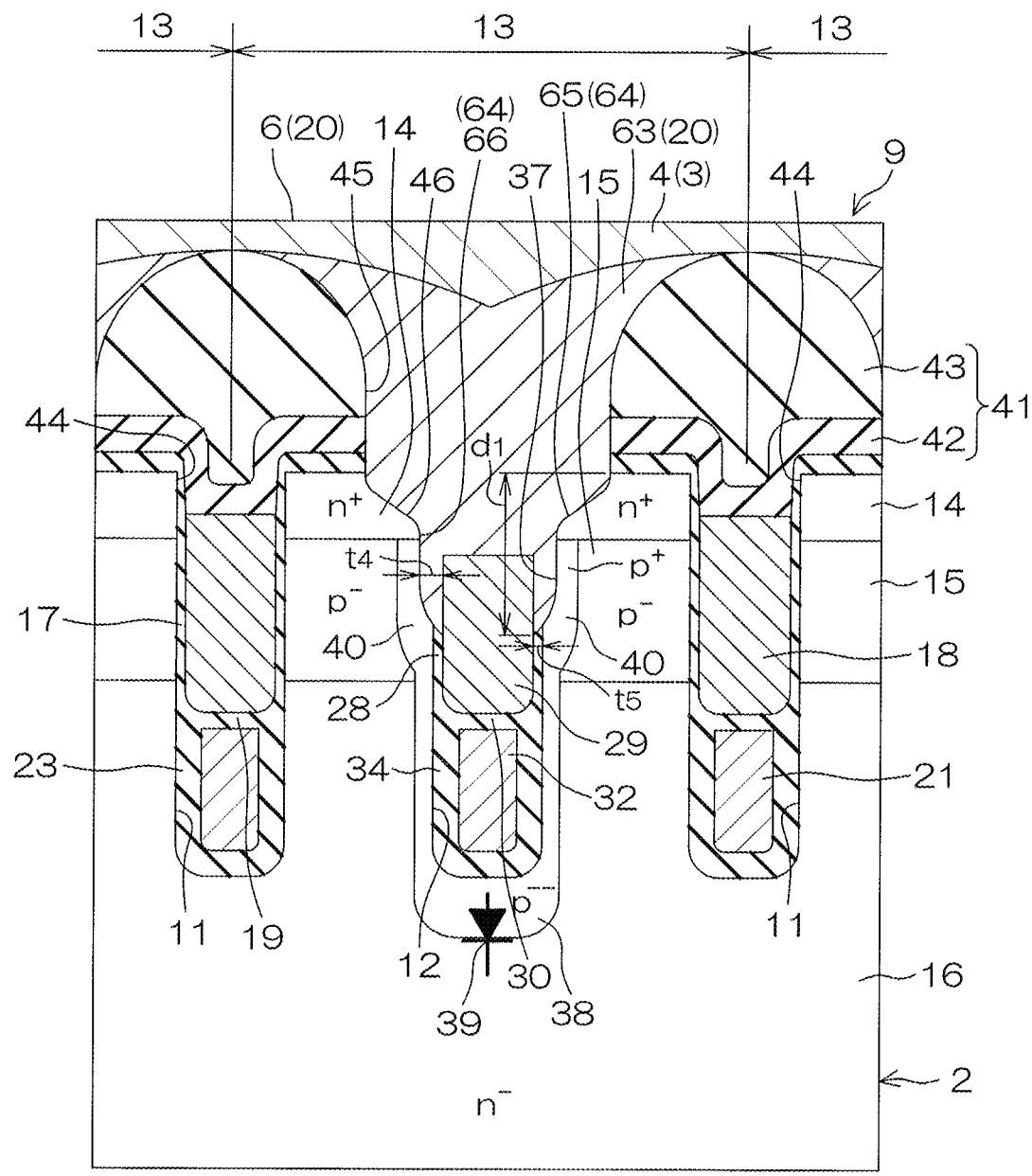
FIG. 7B illustrates a first structure of the semiconductor device.

FIGS. 7A and 7B show comparison between the structure (first structure) of the above-described semiconductor device 1 and the structure (second structure) of a semiconductor device 60, where FIG. 7A shows the semiconductor device 60 and FIG. 7B shows the semiconductor device 1.

First, the semiconductor device 60 shown in FIG. 7A is different from the semiconductor device 1 in that neither a clearance gap 37 nor a recessed portion 46 is provided. Instead, the semiconductor device 60 includes a recessed portion 61 defined in a surficial portion of the semiconductor substrate 2 to have a width greater than that of the recessed portion 46. The recessed portion 61 may be defined in a self-aligned manner with respect to the contact hole 45. The bottom of the recessed portion 61 may be at an intermediate position of the $p^-$ type body layer 15 in the depth direction of the field plate trench 12. At the simplest level, the recessed portion 61 is formed by removing the protruding portion of the field plate 29 surrounded by the clearance gap 37 in the semiconductor device 1 and increasing the diameter of the upper portion of the field plate trench 12. Such a recessed portion 61 can be achieved by supplying etching gas capable of etching the field plate 29 (polysilicon), the semiconductor substrate 2 (silicon), and the insulating film 28 (silicon oxide) at approximately the same rate in the step shown in FIG. 6L, for example.

Then, in the semiconductor device 60, since the $p^-$ type body layer 15 is also exposed at the bottom of the recessed portion 61, the $p^+$ type body contact layer 40 is to be defined extensively into a region at the bottom of the recessed portion 61 in the semiconductor substrate 2. Accordingly, p type impurity ions, when being injected for the $p^+$ type body contact layer 40, may be diffused even to a channel defining portion near the gate insulating film 17.

In contrast, in the semiconductor device 1 shown in FIG. 7B, the region of definition of the $p^+$ type body contact layer 40 in the semiconductor substrate 2 is limited mainly to the side surface of the field plate trench 12 in the clearance gap 37 exposed through etching of the insulating film 28. The $p^+$ type body contact layer 40 is thus defined along the side surface of the field plate trench 12. This can make the $p^+$ type body contact layer 40 less likely to affect the channel defining portion near the gate insulating film 17. As a result, an increased contact depth $d_1$ of the source contact 63 (source electrode 20) can improve the avalanche resistance without sacrificing the properties such as ON-resistance. It is noted that the term "contact depth $d_1$" may indicate the depth from the surface of the semiconductor substrate 2 to the upper end of the $p^+$ type body contact layer 40 and may be, for example, 0.2 μm to 0.6 μm.

In addition, even if a lithography displacement may occur before the etching for definition of the clearance gap 37, the region of definition of the $p^+$ type body contact layer 40 cannot be displaced because the position of the insulating film 28, which is an etching target, remains unchanged (self-alignment). This also allows the variation in the properties such as the gate threshold voltage $V_{th}$ to be reduced.

Further, by virtue of the clearance gap 37, even when p type impurity ions may be injected, the $p^+$ type body contact layer 40 is less likely to extend horizontally (a direction along the surface of the semiconductor substrate 2). Accordingly, in a narrowed pitch structure in which the pitch $P_2$ is 0.5 μm to 1.5 μm, the effect on the channel defining portion can particularly be reduced effectively.

Further, in the semiconductor device 1, the line insulating film 23 is formed of the thermal oxidation film 55 and the deposition insulating film 56 at least at the bottom of the gate trench 11, whereby the effect of the thermal oxidation stress at the bottom of the gate trench 11 can be reduced. This allows the gate insulating film 17 to be thickened easily at the bottom of the gate trench 11, with increased MIS structure voltage resistance and reduced leakage current for increased device electrostatic destruction resistance (ESD resistance).

That is, even if the contact depth $d_1$ of the source contact 63 may not be increased, the combination of the thermal oxidation film 55 and the deposition insulating film 56 can improve the resistance of the device sufficiently. Hence, the semiconductor device 60 (second structure) may be formed to have a relatively small contact depth $d_1$ so that the p type impurity ions injected into the $p^-$ type body layer 15 are less likely to be diffused into the channel defining portion. This is because the reduction in the voltage resistance due to reduction in the contact depth $d_1$ can be compensated for by the combination of the thermal oxidation film 55 and the deposition insulating film 56.

On the other hand, the gate insulating film 17 opposed to the $p^-$ type body layer 15 (channel defining portion) around the side surface of the gate trench 11 is formed in a step different from that for the line insulating film 23. Accordingly, the thickness of the gate insulating film 17 can be designed separately from the thickness of the line insulating film 23 at the bottom of the gate trench 11, which makes it possible to achieve a good channel property regardless of the thickness of the line insulating film 23. In addition, since the gate insulating film 17 is formed only through thermal oxidation processing, a good film can be arranged on the p type body layer 15 (channel defining portion) around the side surface of the gate trench 11.

While one preferred embodiment of the present invention has above been described, the present invention can also be practiced in other forms.

For example, an arrangement may be employed in which the conductivity type of each semiconductor portion in the semiconductor devices 1, 60 is inverted. That is, in the semiconductor devices 1, 60, the p type portions may be n type, while the n type portions may be p type.

Also, the space between the side surface of the field plate trench 12 and the field plate 29, which is defined as "clearance gap" for convenience sake, may not be referred to as "clearance gap" depending on its width.

Further, the field plate 29 may not be an element embedded in the trench of each unit cell 13 for definition of the clearance gap 37. An element is applicable as long as it has etching selectivity with the insulating film 28.

Various other design changes may be made within the scope of the matters as set forth in the appended claims.

<Reference Invention>

In addition to the "PROBLEMS TO BE SOLVED BY THE INVENTION" above, in trench-type MISFETs, a contact layer with a high impurity concentration is preferably defined at as deep a position as possible in the body layer for improvement in the avalanche resistance. For example, in Patent Document 1, the second groove may be etched deeply and then a $p^+$ type region may be defined through ion injection.

However, in this approach, the $p^+$ type region may affect the channel defining portion near the gate insulating film to result in an increase in the ON-resistance. It is therefore necessary to make certain sacrifices to increase the contact depth and thereby improve the avalanche resistance.

In addition, a lithography displacement is likely to occur during trench etching for the contact, which may cause a variation in the properties such as the gate threshold voltage $V_{th}$.

A preferred embodiment of the reference invention provides a trench gate-type semiconductor device in which the avalanche resistance can be improved without sacrificing the properties such as ON-resistance, and a method for manufacturing such a semiconductor device.

A preferred embodiment of the reference invention provides a semiconductor device including a semiconductor layer, a gate trench defined in the semiconductor layer, a gate insulating film arranged on the inner surface of the gate trench, a gate electrode arranged in the gate trench via the gate insulating film, a recessed part defined in the semiconductor layer with a space kept from the gate trench, a source layer, a body layer, and a drain layer arranged in a portion between the gate trench and the recessed part, an embedded portion arranged in the recessed part to define a space between the embedded portion and the side surface of the recessed part, a body contact layer arranged in the body layer around the side surface of the recessed part, and a contact electrode entering into a space between the side surface of the recessed part and the embedded portion to be connected to the body contact layer (item 1).

Also, a preferred embodiment of the reference invention provides a semiconductor device manufacturing method including the steps of defining a gate trench and a recessed part in a semiconductor layer, embedding a gate electrode in the gate trench via a gate insulating film, embedding an embedded portion having etching selectivity with a sacrificial film in the recessed part via the sacrificial film, defining a source layer, a body layer, and a drain layer in a portion between the gate trench and the recessed part, selectively etching the sacrificial film to define a space between the side surface of the recessed part and the embedded portion, defining a body contact layer in the body layer around the side surface of the recessed part through ion injection into the space, and defining a contact electrode so as to enter into a space between the side surface of the recessed part and the embedded portion (item 9).

In accordance with the arrangement above, the region of definition of the body contact layer in the semiconductor layer is limited mainly to the side surface of the recessed part in the space provided through etching of the sacrificial film. The body contact layer is thus defined along the side surface of the recessed part. This can make the body contact layer less likely to affect the channel defining portion near the gate insulating film. As a result, an increased contact depth of the contact electrode can improve the avalanche resistance without sacrificing the properties such as ON-resistance.

In addition, even if a lithography displacement may occur before the etching for definition of the space, the region of definition of the body contact layer cannot be displaced because the position of the sacrificial film, which is an etching target, remains unchanged (self-alignment). This also allows the variation in the properties such as the gate threshold voltage $V_{th}$ to be reduced.

A preferred embodiment of the reference invention may further include the steps of forming the sacrificial film as an insulating film in the same film forming step as the gate insulating film and forming the embedded portion in the same film forming step as that of the gate electrode, in which the step of defining a space may include the step of selectively etching the insulating film to define a clearance gap (item 10).

That is, since the gate insulating film and the insulating film are formed to have the same thickness in the same film forming step, the clearance gap generated through etching of the insulating film is the same level as the thickness of the gate insulating film (item 2). The clearance gap may be, for example, 20 nm to 100 nm.

In a preferred embodiment of the reference invention, the step of defining the recessed part may include the step of defining a field plate trench in the semiconductor layer and the step of defining the embedded portion may include the step of embedding a field plate in the field plate trench via the insulating film (item 11).

This may cause the unetched insulating film to continue into the lower end of the clearance gap between the side surface of the field plate trench and the field plate (item 3).

In a preferred embodiment of the reference invention, the step of etching the sacrificial film may include a reactive ion etching step (item 12).

This allows the sacrificial film, which is a thin etching target, to be etched deeply and successfully.

In a preferred embodiment of the reference invention, the field plate may be made of the same material as the gate electrode and the insulating film may be made of the same material as the gate insulating film (item 4).

In a preferred embodiment of the reference invention, the gate electrode and the field plate may be composed of polysilicon, while the gate insulating film and the insulating film may be composed of silicon oxide (item 5).

A preferred embodiment of the reference invention may further include an embedded electrode arranged below the gate electrode via the gate insulating film in the gate trench and an embedded field plate electrode arranged below the field plate via the insulating film in the field plate trench (item 6).

In a preferred embodiment of the reference invention, the pitch between the gate trench and the recessed part may be 0.4 μm to 2.0 μm (item 7).

As described above, in a preferred embodiment of the reference invention, the region of definition of the body contact layer is limited mainly to the side surface of the recessed part in the space provided through etching of the sacrificial film, whereby the body contact layer is less likely to extend horizontally (a direction along the surface of the semiconductor layer). Accordingly, in such a narrowed pitch structure, the effect on the channel defining portion can particularly be reduced effectively.

In a preferred embodiment of the reference invention, the contact electrode may include a source electrode electrically connected to the source layer (item 8).

The present application corresponds to Japanese Patent Application No. 2015-90576 filed in the Japan Patent Office on Apr. 27, 2015 and Japanese Patent Application No. 2015-90577 filed in the Japan Patent Office on Apr. 27, 2015, the disclosure of which is incorporated herein by reference in its entirety.

EXAMPLE

Next, the present invention will be described based on an example, which is not intended to limit the present invention thereto.

First, the effect of definition of the $p^+$ type body contact layer 40 through ion injection via the clearance gap 37 will be described.

For a semiconductor device of a third structure in which the gate insulating film 17 and the insulating film 28 are further defined by a single thermal oxidation film in the semiconductor device 60 (second structure), the correlative relationship between the contact depth $d_1$ and the gate threshold voltage $V_{th}$ and the ON-resistance was investigated. The results are shown in FIG. 8 and FIG. 9.

Figure 8:
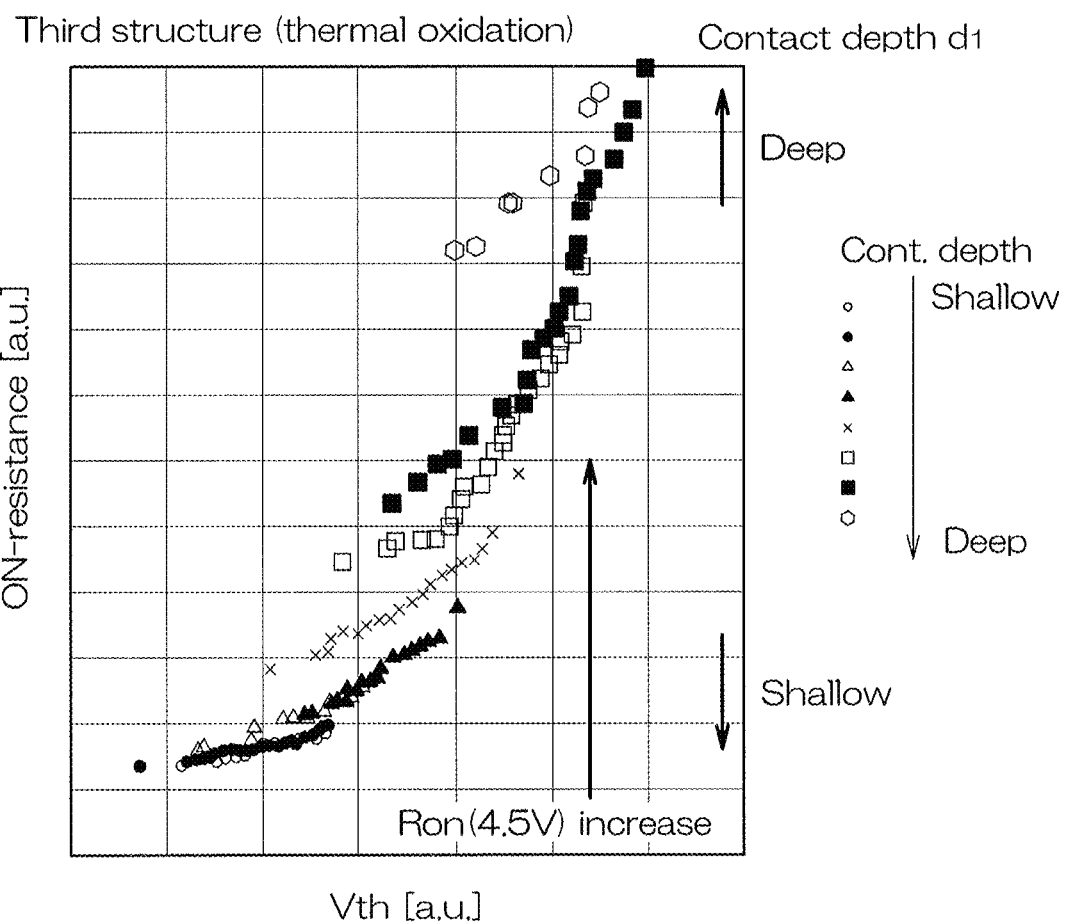
FIG. 8 illustrates the correlative relationship between the contact depth and the gate threshold voltage $V_{th}$ and the ON-resistance.
Figure 9:
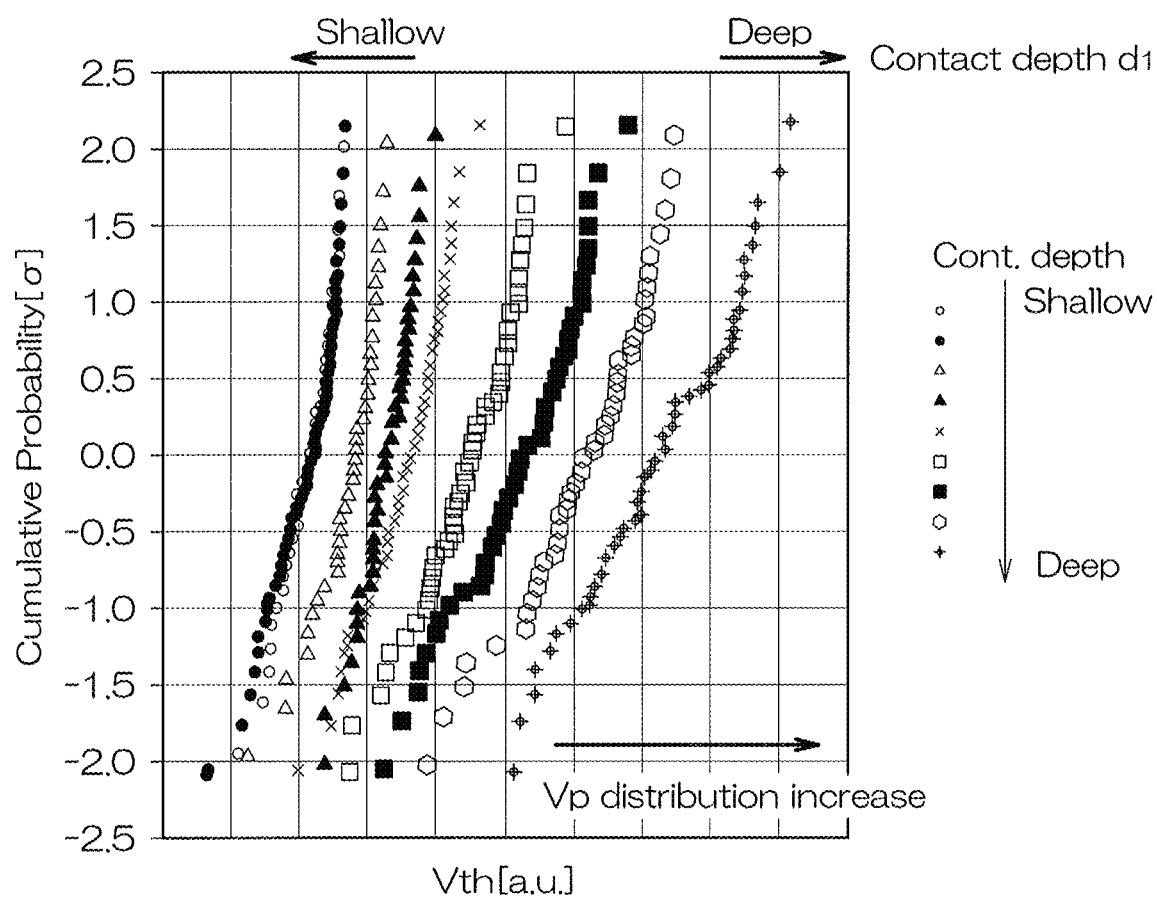
FIG. 9 illustrates the correlative relationship between the contact depth and the gate threshold voltage $V_{th}$.

FIG. 8 shows that the greater the contact depth $d_1$, the higher the ON-resistance becomes. This may be because the $p^+$ type body contact layer 40 is dominant in the $p^-$ type body layer 15 to affect the channel defining portion. This shows that the contact depth $d_1$ needs to be reduced to keep the ON-resistance low, while the ON-resistance must be sacrificed to increase the contact depth $d_1$ and thereby improve the avalanche resistance. FIG. 9 also shows that the greater the contact depth $d_1$, the higher the gate threshold voltage $V_{th}$ and its variation become. This may also be because the $p^+$ type body contact layer 40 is dominant in the $p^-$ type body layer 15, as is the case in FIG. 8.

With such a background, the $p^+$ type body contact layer 40, which is defined through ion injection via the clearance gap 37, can be prevented from being dominant in the $p^-$ type body layer 15 in the semiconductor device 1. That is, even if the contact depth $d_1$ may be increased, the ON-resistance can be kept relatively low and also the variation in the properties such as the gate threshold voltage $V_{th}$ can be reduced. It is obviously possible to benefit also from an increase in the contact depth $d_1$, that is, the avalanche resistance is improved.

Figure 10:
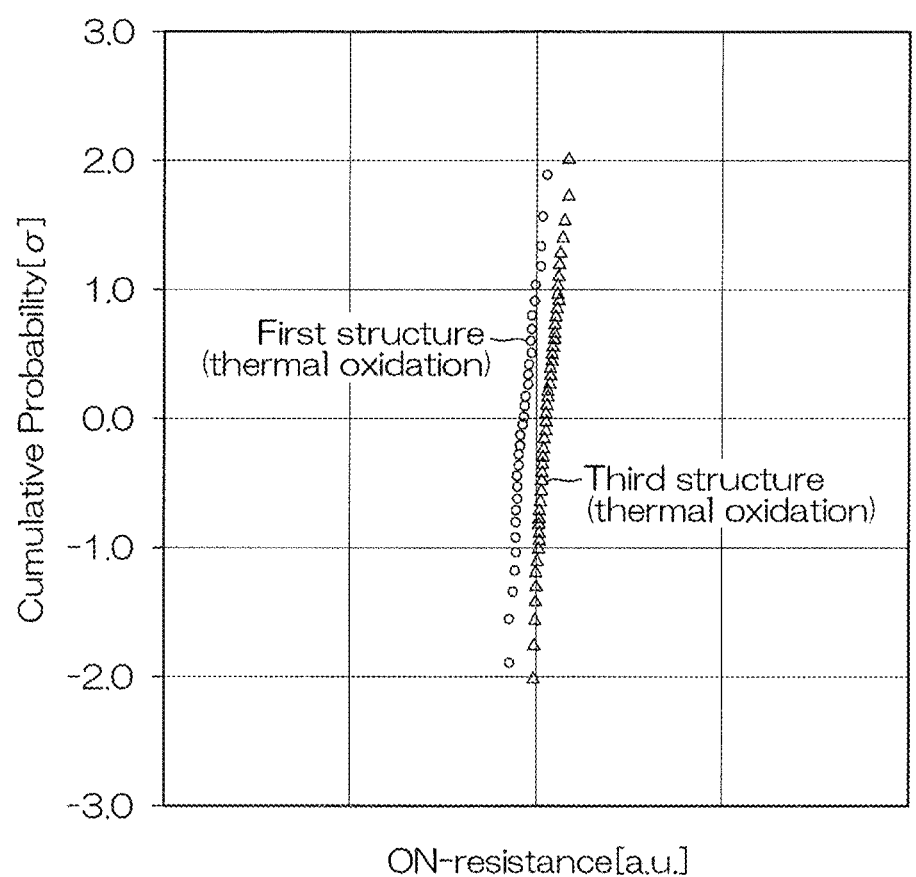
FIG. 10 shows a comparison of the ON-resistance between the first structure and a third structure.
Figure 11:
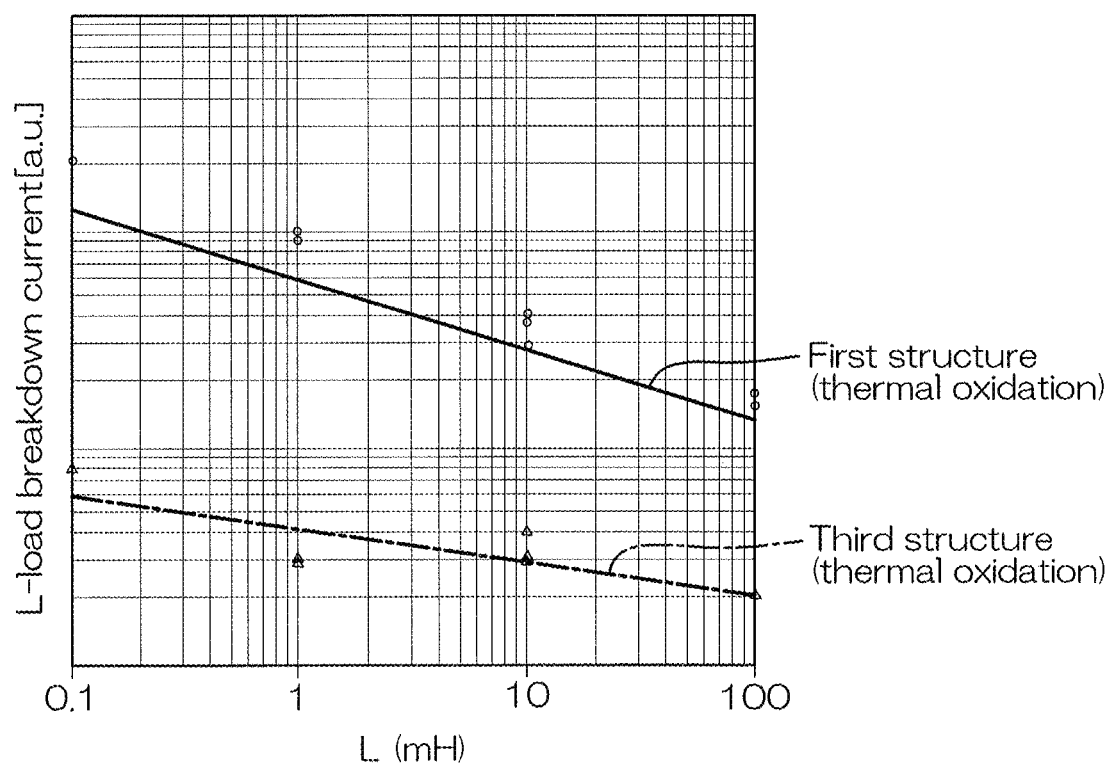
FIG. 11 shows a comparison of the avalanche resistance between the first structure and the third structure.

Then, in order to verify the above-described effect, the ON-resistance and the avalanche resistance were compared between the first structure (semiconductor 1) and the third structure. The results are shown in FIG. 10 and FIG. 11. It is noted that the first structure is specified to include the gate insulating film 17 and the insulating film 28 as a single thermal oxidation film, as is the case with the third structure.

As is clear from FIG. 10 and FIG. 11, the first structure (thermal oxidation) exhibits a slightly low ON-resistance, while a significant improvement in the avalanche resistance, compared to the third structure (thermal oxidation).

Next, the effect of formation of the line insulating film 23 through combination of the thermal oxidation film 55 and the deposition insulating film 56 will be described.

The voltage resistance and the ESD resistance were compared between the second structure (thermal oxidation+CVD), which is the above-described configuration of the semiconductor device 60, and the third structure (thermal oxidation). The results are shown in FIG. 12 and FIG. 13.

Figure 12:
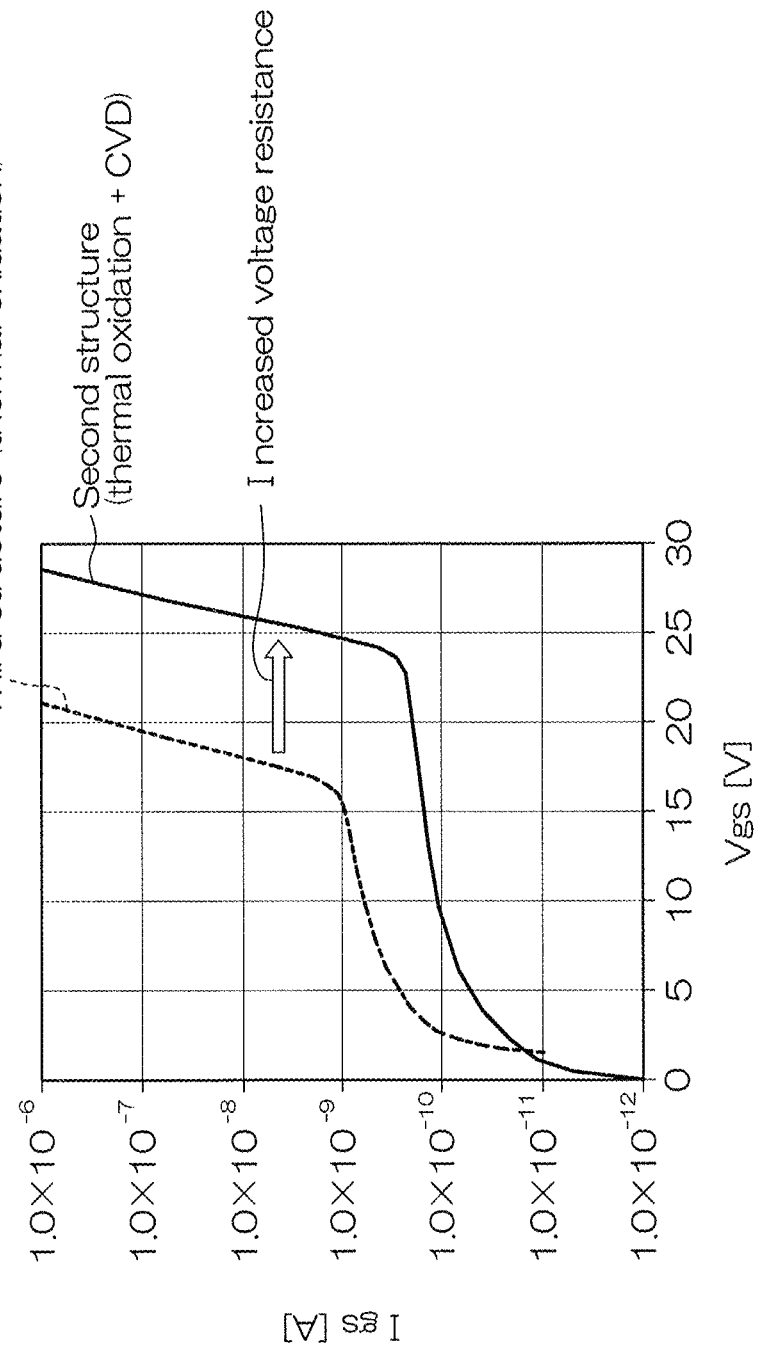
FIG. 12 shows a comparison of the voltage resistance between the second structure and the third structure.
Figure 13:
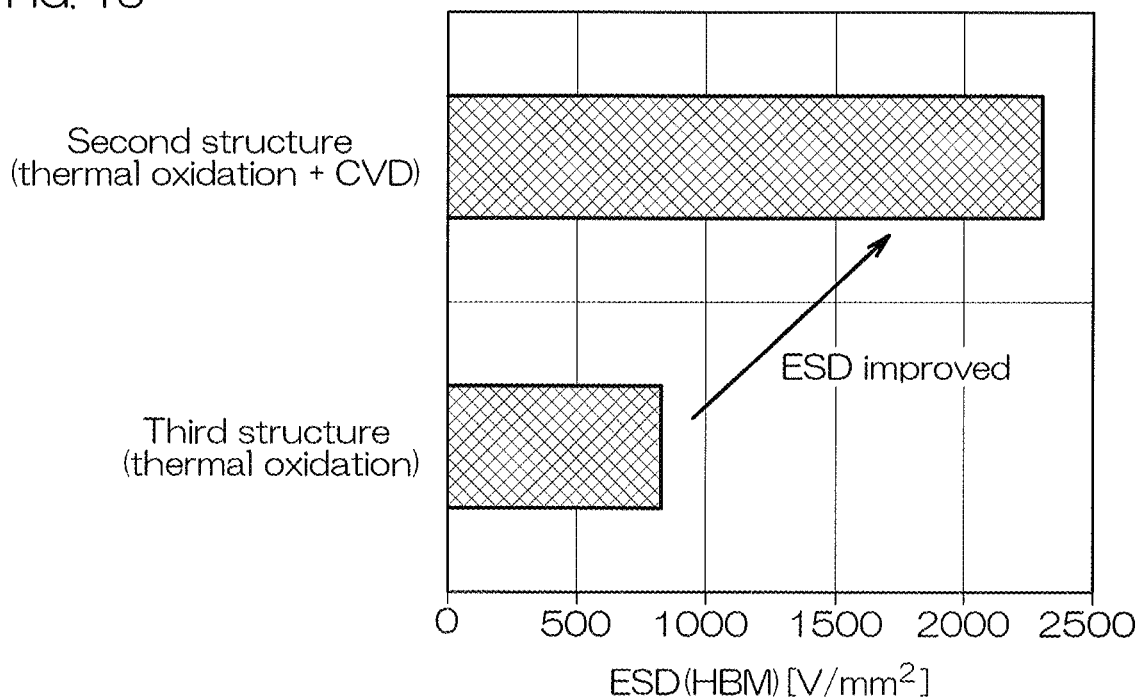
FIG. 13 shows a comparison of the ESD resistance between the second structure and the third structure.
Figure 14:
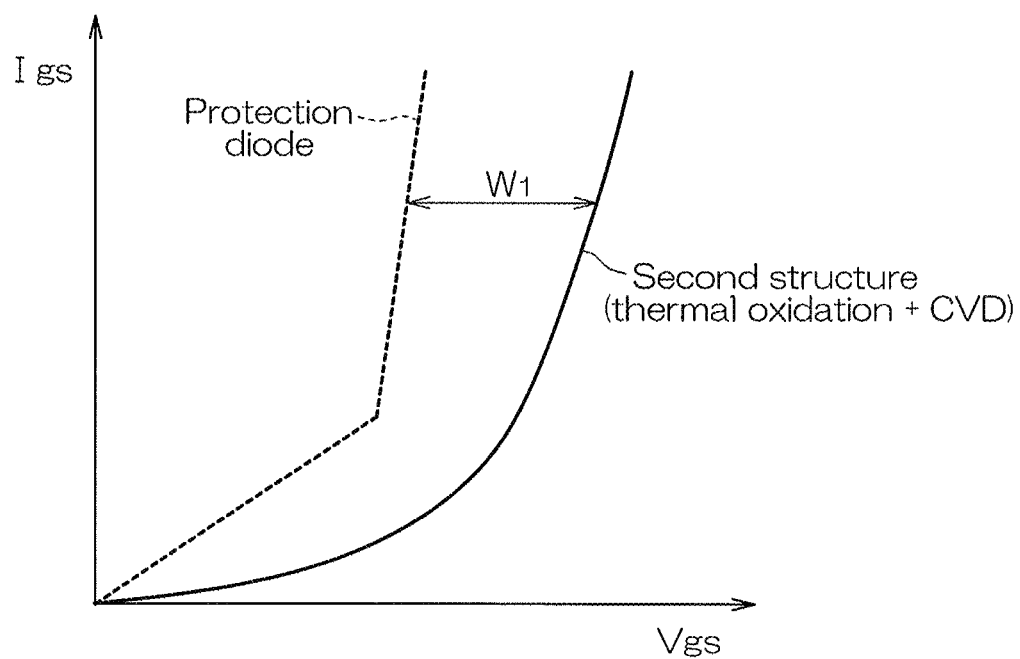
FIG. 14 shows a comparison of the voltage resistance between the second structure and a protection diode.

As is clear from FIG. 12 and FIG. 13, the second structure (thermal oxidation+CVD) exhibits an increase in both the voltage resistance and the ESD resistance, compared to the third structure (thermal oxidation). From this, as shown in FIG. 14, the width $W_1$ can be increased between the curve indicating the voltage resistance of the protection diode 51 (see FIG. 4) and the curve indicating the voltage resistance of the MIS structure in the semiconductor device 60, whereby in the case of, for example, an abnormal voltage such as surge and/or static electricity, the current can preferentially flow through the protection diode 51. This can suppress damage to the device. In addition, since the width $W_1$ is increased by increasing the voltage resistance of the MIS structure in the semiconductor device 60, the voltage resistance of the protection diode 51 can also be maintained.

REFERENCE SIGNS LIST

1 Semiconductor device
2 Semiconductor substrate

3 Electrode film
4 Source metal
5 Gate metal
6 Source pad
7 Gate pad
8 Pad boundary portion
9 Active region
10 Non-active region
11 Gate trench
12 Field plate trench
13 Unit cell
14 n⁺ type source layer
15 p⁻ type body layer
16 n type drain layer
17 Gate insulating film
18 Gate electrode
19 Bottom (of gate insulating film)
20 Source electrode
21 Embedded electrode
23 Line insulating film
24 First portion
25 Second portion
26 Virtual interface
27 Boundary portion
28 Insulating film
29 Field plate
30 Bottom (of insulating film)
32 Embedded field plate
34 Line insulating film
35 First portion
36 Second portion
37 Clearance gap
38 p⁻⁻ type layer
39 Body diode
40 p⁺ type body contact layer
41 Interlayer insulating film
42 Silicon nitride film
43 Silicon oxide film
44 Recessed portion
45 Contact hole
46 Recessed portion
47 Insulating film
48 n⁺ type semiconductor film
49 Contact
50 Contact
51 Protection diode
52 p⁺ type region
53 Hard mask
54 Mask
55 Thermal oxidation film
56 Deposition insulating film
57 Insulating film
58 Electrode material
59 Electrode material
60 Semiconductor device
61 Recessed portion
62 Passivation film
63 Source contact
64 Side surface (of recessed portion)
65 First surface
66 Second surface

The invention claimed is:

1. A semiconductor device comprising:
a semiconductor layer;
a gate trench defined in the semiconductor layer;
a first insulating film arranged on an inner surface of the gate trench;
a gate electrode arranged in the gate trench on the first insulating film;
a source layer, a body layer, and a drain layer arranged laterally to the gate trench;
an embedded electrode arranged below the gate electrode in the gate trench;
a field plate trench defined in the semiconductor layer in a manner spaced from the gate trench such that the source layer, the body layer, and the drain layer are exposed from an inner surface of the field plate trench, with the field plate trench and the gate trench arranged alternately along a front surface of the semiconductor layer in a cross sectional view;
a second insulating film arranged on the inner surface of the field plate trench;
a field plate arranged in the field plate trench on the second insulating film, the field plate including an upper field plate and a lower field plate that are insulated and separated vertically;
an interlayer insulating film having a contact hole formed on the semiconductor layer; and
a source contact electrically connected to the source layer and the upper field plate in the contact hole, the source contact having a base portion covering a side surface of the contact hole of the interlayer insulating film, and two branched portions that are integral with the base portion and branching downwardly from an upper surface of the upper field plate, and each branched portion having a round tapered shape in a cross sectional view,
wherein the first insulating film includes, at least at a bottom of the gate trench, a first portion and a second portion on the first portion,
the second portion of the first insulating film is separated from the inner surface of the gate trench by the first portion and has a film elaborateness lower than that of the first portion,
the film elaborateness is determined based on a difference in rates of etching of the first portion and the second portion using hydrofluoric acid,
the second portion has an etching rate to hydrofluoric acid higher than that of the first portion by having the film elaborateness lower than that of the first portion,
the first insulating film includes a gate insulating film covering the gate electrode for insulation separation between the gate electrode and the embedded electrode and a line insulating film covering the embedded electrode,
the first portion and the second portion of the first insulating film are provided in the line insulating film,
the gate insulating film includes a first central portion and first end portions in the cross sectional view such that a height level of the gate insulating film gradually lowers from the first central portion to the first end portions,
the embedded electrode includes a second central portion and second end portions in the cross sectional view such that a height level of the embedded electrode gradually lowers from the second central portion to the second end portions,
a lower end surface and an upper end surface of the embedded electrode and a lower end surface and an upper end surface of the lower field plate in the cross sectional view are positioned at the same level, respectively, a lower end surface of the gate electrode and a lower end surface of the upper field plate in the cross sectional view are positioned at the same level, an upper end surface of the upper field plate is positioned at a level lower than an upper end surface of the gate electrode in the cross sectional view, the upper field plate has a pair of side surfaces in the cross sectional view, and the pair of side surfaces of the upper field plate is covered with the two branched portions.

2. The semiconductor device according to claim 1, wherein the gate insulating film has the same degree of elaborateness as the first portion in the entire thickness direction of the gate insulating film.

3. The semiconductor device according to claim 1, wherein the gate insulating film and the line insulating film meet each other on the inner surface of the gate trench, and the film thickness of a meeting portion between the gate insulating film and the line insulating film is equal to or greater than 75% of the film thickness of a portion of the gate insulating film.

4. The semiconductor device according to claim 1, wherein the first insulating film is composed of silicon oxide.

5. The semiconductor device according to claim 1, wherein the gate electrode is composed of polysilicon.

6. The semiconductor device according to claim 1, further comprising:

an impurity region having the same conductivity type as the body layer, the impurity region having a first impurity concentration higher than that of the body layer, and the impurity region being formed in the body layer along the inner surface of the field plate trench; and a second impurity region having the same conductivity type as the body layer, the second impurity region having a second impurity concentration lower than that of the impurity region, wherein the second insulating film includes, at least at a bottom of the field plate trench, a first field insulator portion and a second field insulator portion on the first field insulator portion, the second field insulator portion of the second insulating film is separated from the inner surface of the field plate trench by the first field insulator portion and has a second film elaborateness lower than that of the first field insulator portion, the second film elaborateness is determined based on a difference in rates of etching of the first field insulator portion and the second field insulator portion using hydrofluoric acid, the second field insulator portion has an etching rate to hydrofluoric acid higher than that of the first field insulator portion by having the second film elaborateness lower than that of the first field insulator portion, and the second impurity region is electrically connected to the body layer at an upper portion thereof, and is formed along the inner surface of the field plate trench downwardly from the connection position with the body layer.

7. The semiconductor device according to claim 6, wherein the first field insulator portion and the second field insulator portion of the second insulating film are provided in a portion of the second insulating film covering the lower field plate.

8. The semiconductor device according to claim 6, wherein the source contact is sandwiched between a first portion of the field plate and a first portion of the body layer at the inner surface of the field plate trench, wherein the second insulating film is sandwiched between a second portion of the field plate and a second portion of the body layer at the inner surface of the field plate trench, and the second insulating film is in contact with the source contact at a region adjacent to the body layer.

9. The semiconductor device according to claim 6, wherein the second impurity region is formed along the entire inner surface of the field plate trench downwardly from the connection position with the body layer, and a body diode is formed by a pn junction between the second impurity region and the drain layer underneath the field plate trench.

10. A semiconductor device comprising:

a semiconductor layer;

a gate trench defined in the semiconductor layer;

a first insulating film arranged on an inner surface of the gate trench;

a gate electrode arranged in the gate trench on the first insulating film;

a source layer, a body layer, and a drain layer arranged laterally to the gate trench;

an embedded electrode arranged below the gate electrode in the gate trench;

a field plate trench defined in the semiconductor layer in a manner spaced from the gate trench such that the source layer, the body layer and the drain layer are exposed from an inner surface of the field plate trench, with the field plate trench and the gate trench arranged alternately along a front surface of the semiconductor layer in a cross sectional view;

a second insulating film arranged on the inner surface of the field plate trench;

a field plate arranged in the field plate trench on the second insulating film, the field plate including an upper field plate and a lower field plate insulated and separated vertically;

an interlayer insulating film having a contact hole formed on the semiconductor layer; and a source contact electrically connected to the source layer and the upper field plate in the contact hole, the source contact having a base portion covering a side surface of the contact hole of the interlayer insulating film, and two branched portions that are integral with the base portion and branching downwardly from an upper surface of the upper field plate, and each branched portion having a round tapered shape in a cross sectional view, wherein the first insulating film includes, at least at a bottom of the gate trench, a first portion and a second portion on the first portion, deposited by a different process than the first portion and separated from the inner surface of the gate trench by the first portion, the first insulating film includes a gate insulating film covering the gate electrode for insulation separation between the gate electrode and the embedded electrode and a line insulating film covering the embedded electrode, the first portion and the second portion of the first insulating film are provided in the line insulating film, the gate insulating film includes a first central portion and first end portions in the cross sectional view such that a height level of the gate insulating film gradually lowers from the first central portion to the first end portions, the embedded electrode includes a second central portion and second end portions in the cross sectional view such that a height level of the embedded electrode gradually lowers from the second central portion to the second end portions, a lower end surface and an upper end surface of the embedded electrode and a lower end surface and an upper end surface of the lower field plate in the cross sectional view are positioned at the same level, respectively, a lower end surface of the gate electrode and a lower end surface of the upper field plate in the cross sectional view are positioned at the same level, an upper end surface of the upper field plate is positioned at a level lower than an upper end surface of the gate electrode in the cross sectional view, the upper field plate has a pair of side surfaces in the cross sectional view, and the pair of side surfaces of the upper field plate is covered with the two branched portions.

11. The semiconductor device according to claim 10, wherein the first insulating film is formed by a similar process to that of the first portion.

12. The semiconductor device according to claim 10, further comprising:

an impurity region having the same conductivity type as the body layer, the impurity region having a first impurity concentration higher than that of the body layer, and the impurity region formed in the body layer along the inner surface of the field plate trench; and a second impurity region having the same conductivity type as the body layer, the second impurity region having a second impurity concentration lower than that of the impurity region, wherein the second insulating film includes, at least at a bottom of the field plate trench, a first field insulator portion and a second field insulator portion formed in a different process than that of the first field insulator portion and separated from the inner surface of the field plate trench by the first field insulator portion, and the second impurity region is electrically connected to the body layer at an upper portion thereof, and is formed along the inner surface of the field plate trench downwardly from the connection position with the body layer.

13. The semiconductor device according to claim 12, wherein the second impurity region is formed along the entire inner surface of the field plate trench downwardly from the connection position with the body layer, and a body diode is formed by a pn junction between the second impurity region and the drain layer underneath the field plate trench.

* * * * *